(12) United States Patent
Kurita et al.

(10) Patent No.: US 11,935,846 B2
(45) Date of Patent: Mar. 19, 2024

(54) ELECTRONIC DEVICE

(71) Applicants: Kabushiki Kaisha Toshiba, Tokyo (JP); Toshiba Electronic Devices & Storage Corporation, Tokyo (JP)

(72) Inventors: Yoichiro Kurita, Tokyo (JP); Takanobu Kamakura, Kanagawa (JP); Masayuki Sugiura, Kanagawa (JP); Yoshiaki Aizawa, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/310,094

(22) Filed: May 1, 2023

(65) Prior Publication Data
US 2023/0268294 A1    Aug. 24, 2023

Related U.S. Application Data

(63) Continuation of application No. 17/194,031, filed on Mar. 5, 2021, now Pat. No. 11,676,919.

(30) Foreign Application Priority Data

Sep. 9, 2020    (JP) ................................. 2020-151324

(51) Int. Cl.
*H01L 23/64* (2006.01)
*H01L 23/00* (2006.01)
(Continued)

(52) U.S. Cl.
CPC ........ *H01L 23/645* (2013.01); *H01L 23/3107* (2013.01); *H01L 23/367* (2013.01); *H01L 24/48* (2013.01); *H01L 2224/48227* (2013.01)

(58) Field of Classification Search
CPC .. H01L 23/645; H01L 23/3107; H01L 23/367
(Continued)

(56) References Cited

U.S. PATENT DOCUMENTS 8,310,025 B2    11/2012   Nakashiba
8,890,286 B2    11/2014   O'Donnell et al.
(Continued)

FOREIGN PATENT DOCUMENTS

JP    2007-067057 A    3/2007
JP    2007-123650 A    5/2007
(Continued)

OTHER PUBLICATIONS

Y. Kurita et al., "UV Assisted Chip-on-Wafer Direct Transfer Bonding (CoW DTB)", Electronics System-Integration Technology Conference, Sep. 18-21, 2018, Dresden, Germany, pp. 1-6.

*Primary Examiner* — Nitin Parekh
(74) *Attorney, Agent, or Firm* — Kim & Stewart LLP

(57) ABSTRACT

An electronic device includes a substrate, a first insulating film on the substrate, a second insulating film on the first insulating film, first and second coils respectively in the first and second insulating films, first and second terminals, and first and second connection conductors. The first and second insulating films contact each other so that the first and second coils are magnetically coupled. The first insulating film includes a first non-contact portion not contacting the second insulating film. One of the first and second insulating films includes a second non-contact portion not contacting the first or second insulating film. The first terminal is provided on the first non-contact portion and electrically connected to the first coil. The second terminal is provided on the second non-contact portion and electrically connected
(Continued)

to the second coil. The first and second connection conductors are connected to the first and second terminals, respectively.

19 Claims, 21 Drawing Sheets

(51) Int. Cl.
  *H01L 23/31* (2006.01)
  *H01L 23/367* (2006.01)
(58) Field of Classification Search
  USPC .......................................................... 257/777
  See application file for complete search history.

(56) References Cited

U.S. PATENT DOCUMENTS

| | | | |
|---|---|---|---|
| 9,160,423 | B2 | 10/2015 | Brauchler et al. |
| 9,219,028 | B1 | 12/2015 | Higgins, III et al. |
| 9,269,654 | B2 | 2/2016 | Willkofer et al. |
| 9,431,379 | B2 | 8/2016 | Kerber et al. |
| 10,418,321 | B2 | 9/2019 | Kuwabara et al. |
| 2008/0042266 | A1 | 2/2008 | Kagaya et al. |
| 2015/0004902 | A1 | 1/2015 | Pigott et al. |
| 2015/0130022 | A1 | 5/2015 | Watanabe et al. |
| 2015/0280785 | A1* | 10/2015 | Brauchler ............ H04B 5/0031 438/3 |
| 2016/0118368 | A1* | 4/2016 | Watanabe ............ H04B 5/005 257/531 |
| 2017/0040246 | A1* | 2/2017 | Shuto .................. H01L 25/0657 |
| 2017/0148751 | A1* | 5/2017 | Watanabe ........... H01L 23/3114 |
| 2017/0179010 | A1* | 6/2017 | Takada .................... H01L 24/49 |
| 2017/0345551 | A1* | 11/2017 | Yoshioka ................ H01F 17/04 |
| 2019/0273066 | A1 | 9/2019 | Kuwabara et al. |
| 2019/0371727 | A1 | 12/2019 | Kuwabara et al. |
| 2021/0060217 | A1 | 3/2021 | Locke et al. |

FOREIGN PATENT DOCUMENTS

| | | |
|---|---|---|
| JP | 2018-139290 A | 9/2018 |
| JP | 2019-009158 A | 1/2019 |
| JP | 2019-153685 A | 9/2019 |
| JP | 2019-212729 A | 12/2019 |

* cited by examiner

ELECTRONIC DEVICE

CROSS-REFERENCE TO RELATED APPLICATIONS

This application is a continuation of U.S. patent application Ser. No. 17/194,031, filed on Mar. 5, 2021, which is based upon and claims the benefit of priority from Japanese Patent Application No. 2020-151324, filed on Sep. 9, 2020; the entire contents of each of which are incorporated herein by reference.

FIELD

Embodiments relate to an electronic device.

BACKGROUND

An electronic device is required, which can be manufactured with low cost.

DETAILED DESCRIPTION

Figure 1:
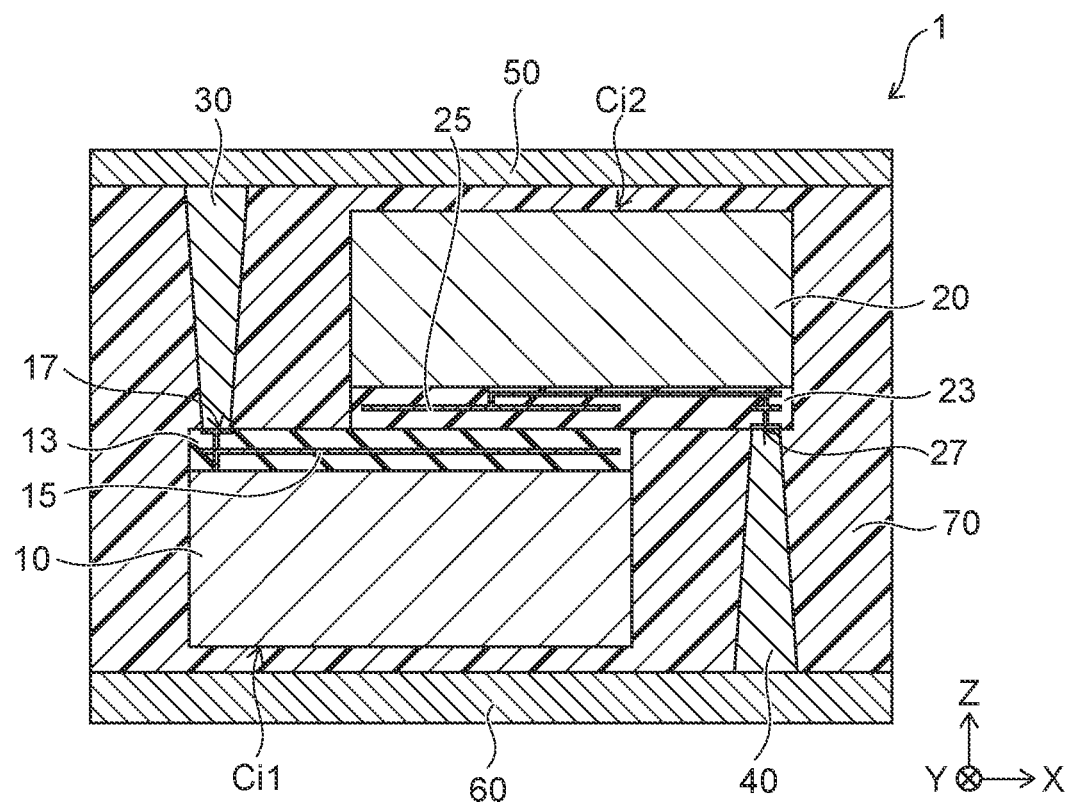
FIG. 1 is a schematic cross-sectional view showing an electronic device according to a first embodiment.

According to one embodiment, an electronic device includes a first substrate, a first insulating film provided on the first substrate, a first coil provided in the first insulating film, a second insulating film provided on the first insulating film, a second coil provided in the second insulating film, first and second terminals, first and second connection conductors. The first insulating film and the second insulating film contact each other so that the first coil and the second coil are magnetically coupled. The second insulating film has a front surface contacting the first insulating film. The second insulating film contacts a front surface of the first insulating film. The first insulating film includes a first non-contact portion not contacting the second insulating film. One of the first and second insulating films includes a second non-contact portion not contacting the second or first insulating film. The first terminal is provided on the front surface of the first insulating film at the first non-contact portion. The first terminal is electrically connected to the first coil. The second terminal is provided on the front surface of the first or second insulating film at the second non-contact portion. The second terminal is electrically connected to the second coil. The first connection conductor is connected to the first terminal. The first connection conductor is electrically connected to the first coil via the first terminal. The second connection conductor is connected to the second terminal. The second connection conductor is electrically connected to the second coil via the second terminal.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing an electronic device 1 according to a first embodiment. The electronic device 1 is, for example, a magnetic coupler. The electronic device 1 includes, for example, a first inductor chip Ci1 and a second inductor chip Ci2.

The first inductor chip Ci1 includes a first substrate 10, a first insulating film 13, and a first coil 15. The first substrate 10 is, for example, a silicon substrate. The first substrate 10 has a front surface, and has a back surface at the side opposite to the front surface. The first insulating film 13 is provided on the front surface of the first substrate 10. The first insulating film 13 is, for example, a silicon oxide film. The first coil 15 is provided in the first insulating film 13. The first coil 15 is, for example, a planar coil. The first coil 15 includes, for example, copper.

The second inductor chip Ci2 includes a second substrate 20, a second insulating film 23, and a second coil 25. The second substrate 20 is, for example, a silicon substrate. The second substrate 20 has a front surface, and has a back surface at the side opposite to the front surface. The second insulating film 23 is provided on the front surface of the second substrate 20. The second insulating film 23 is, for example, a silicon oxide film. The second coil 25 is provided in the second insulating film 23. The second coil 25 is, for example, a planar coil. The second coil 25 includes, for example, copper.

The first inductor chip Ci1 and the second inductor chip Ci2 are bonded so that the first coil 15 and the second coil 25 are magnetically coupled. For example, the first insulating film 13 and the second insulating film 23 contact each other at a portion where the first coil 15 and the second coil 25 are magnetically coupled.

The first insulating film 13 has a front surface, and has a back surface at the side opposite to the front surface. The first insulating film 13 contacts the first substrate 10 at the back surface side of the first insulating film 13 and contacts the second insulating film 23 at the front surface side of the first insulating film 13. The second insulating film 23 contacts the second substrate 20 at the back surface side of the second insulating film 23 and contacts the first insulating film 13 at the front surface side of the second insulating film 23.

The electronic device 1 further includes a first connection conductor 30, a second connection conductor 40, a first external terminal 50, a second external terminal 60, and a resin member 70.

The first connection conductor 30 is electrically connected to the first coil 15 and the first external terminal 50. The second connection conductor 40 is electrically connected to the second coil 25 and the second external terminal 60.

As shown in FIG. 1, the first inductor chip Ci1 and the second inductor chip Ci2 are sealed between the first external terminal 50 and the second external terminal 60 by the resin member 70. The first external terminal 50 and the second external terminal 60 are, for example, metal plates including copper. The resin member 70 is, for example, an epoxy resin.

The first inductor chip Ci1 is provided between the second external terminal 60 and the second inductor chip Ci2. The second inductor chip Ci2 is provided between the first external terminal 50 and the first inductor chip Ci1.

The first inductor chip Ci1 further includes a first connection terminal 17. The first connection terminal 17 is provided at the front surface side of the first insulating film 13. The first connection terminal 17 is provided at a portion of the first insulating film 13 not contacting the second insulating film 23. The first coil 15 is electrically connected to the first connection terminal 17 via a connection member provided in the first insulating film 13. The first connection conductor 30 extends in the resin member 70 and is electrically connected to the first connection terminal 17. The first connection conductor 30 is, for example, a contact plug including copper.

The second inductor chip Ci2 further includes a second connection terminal 27. The second insulating film 23 has a front surface, and has a back surface at the side opposite to the front surface. The second connection terminal 27 is provided at the front surface side of the second insulating film 23. The second connection terminal 27 is provided at a portion of the second insulating film 23 not contacting the first insulating film 13. The second coil 25 is electrically connected to the second connection terminal 27 via a connection member provided in the second insulating film 23. The second connection conductor 40 extends in the resin member 70 and is electrically connected to the second connection terminal 27. The second connection conductor 40 is, for example, a contact plug including copper.

Figure 2A:
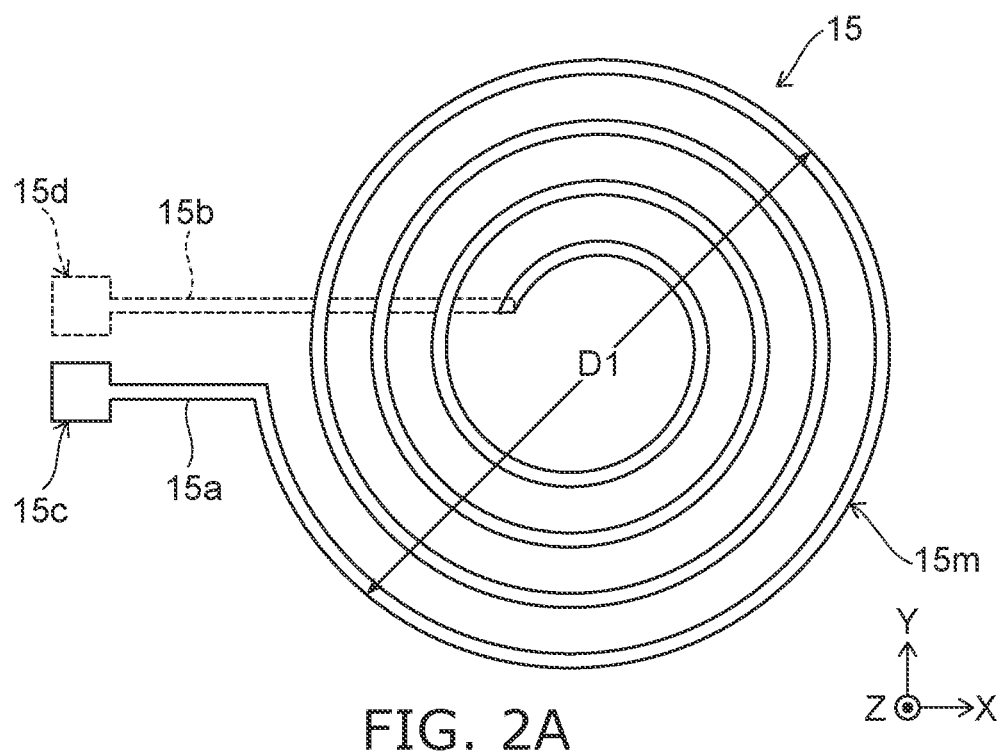
FIGS. 2A and 2B are schematic views showing the electronic device according to the first embodiment.
Figure 2B:
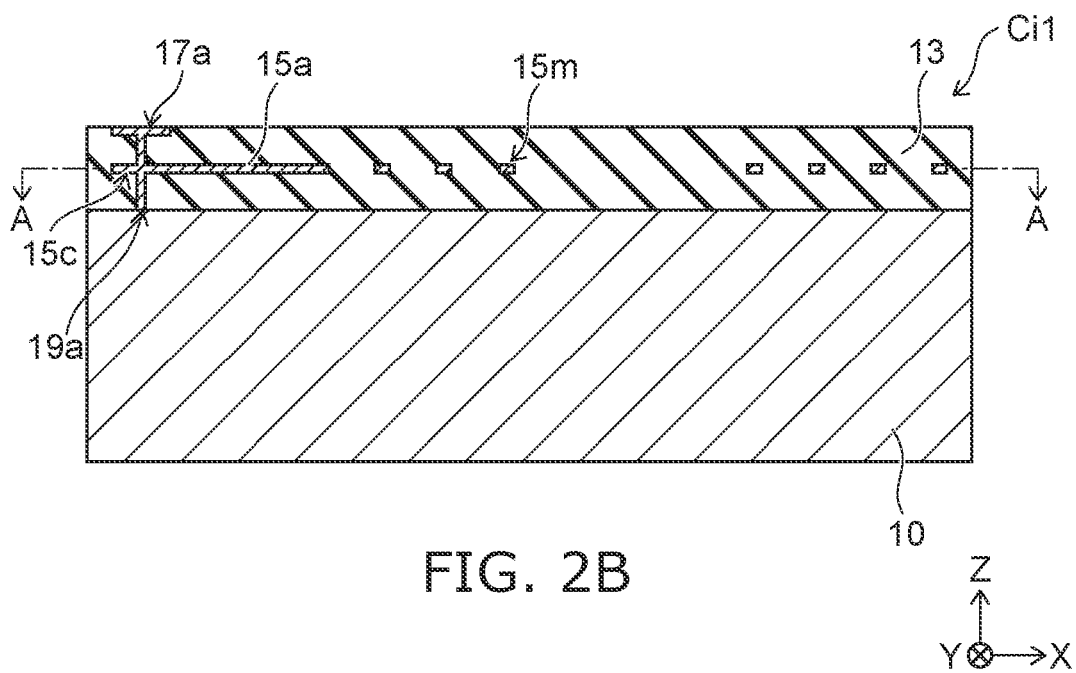

FIGS. 2A and 2B are schematic views showing the electronic device 1 according to the first embodiment. FIG. 2A is a plan view illustrating the first coil 15. FIG. 2A is a cross section along line A-A shown in FIG. 2B. FIG. 2B is a cross-sectional view showing the first inductor chip Ci1.

As shown in FIG. 2A, the first coil 15 is, for example, a spiral-shaped planar coil. The first coil 15 includes a coil portion $15m$, connecting lines $15a$ and $15b$, and connection pads $15c$ and $15d$. The connecting lines $15a$ and $15b$ are connected respectively to two ends of the coil portion $15m$. The connection pad $15c$ is electrically connected to the coil portion $15m$ via the connecting line $15a$. The connection pad $15d$ is electrically connected to the coil portion $15m$ via the connecting line $15b$.

For example, the coil portion $15m$, the connecting line $15a$, and the connection pad $15c$ are provided at the same level in the Z-direction in the first insulating film 13; and the connecting line $15b$ and the connection pad $15d$ are provided at a lower level.

The shape of the coil portion $15m$ is not limited to circular and may be, for example, polygonal. The coil portion $15m$ is not limited to a planar coil and may be a multilevel coil.

As shown in FIG. 2B, a first connection terminal $17a$ is exposed at the front surface side of the first insulating film 13. For example, the first connection terminal $17a$ is electrically connected to the first coil 15 via a contact plug $19a$. For example, the contact plug $19a$ is connected to the connection pad $15c$.

The first inductor chip Ci1 includes, for example, the two first connection terminals $17a$ and $17b$ (not illustrated) electrically connected to the first coil 15. As shown in FIG. 2B, for example, the first connection terminal $17a$ is electrically connected to the connection pad $15c$ of the first coil 15 via the contact plug $19a$. The first connection terminal $17b$ (not illustrated) is electrically connected to the connection pad $15d$ of the first coil 15 via another contact plug $19b$ (not illustrated). For example, the contact plugs $19a$ and $19b$ also may be connected to a circuit (not-illustrated) provided below the contact plugs $19a$ and $19b$.

The second inductor chip Ci2 has the same configuration as the first inductor chip Ci1 shown in FIGS. 2A and 2B. The coil diameter of the second coil 25 may be equal to or different from a coil diameter D1 of the first coil 15. From the perspective of fluctuation when mounting, it is favorable for one of the coil diameters to be larger than the other.

Figure 3A:
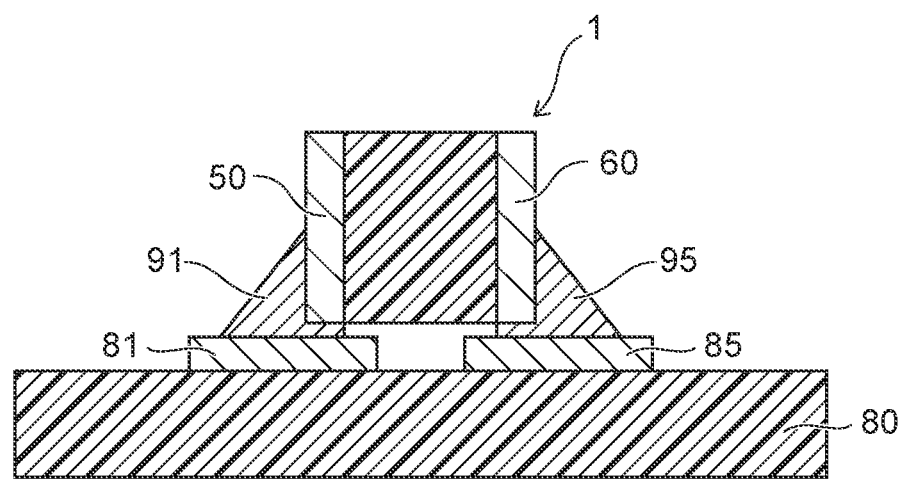
FIGS. 3A and 3B are schematic cross-sectional views showing the electronic device according to the first embodiment.
Figure 3B:
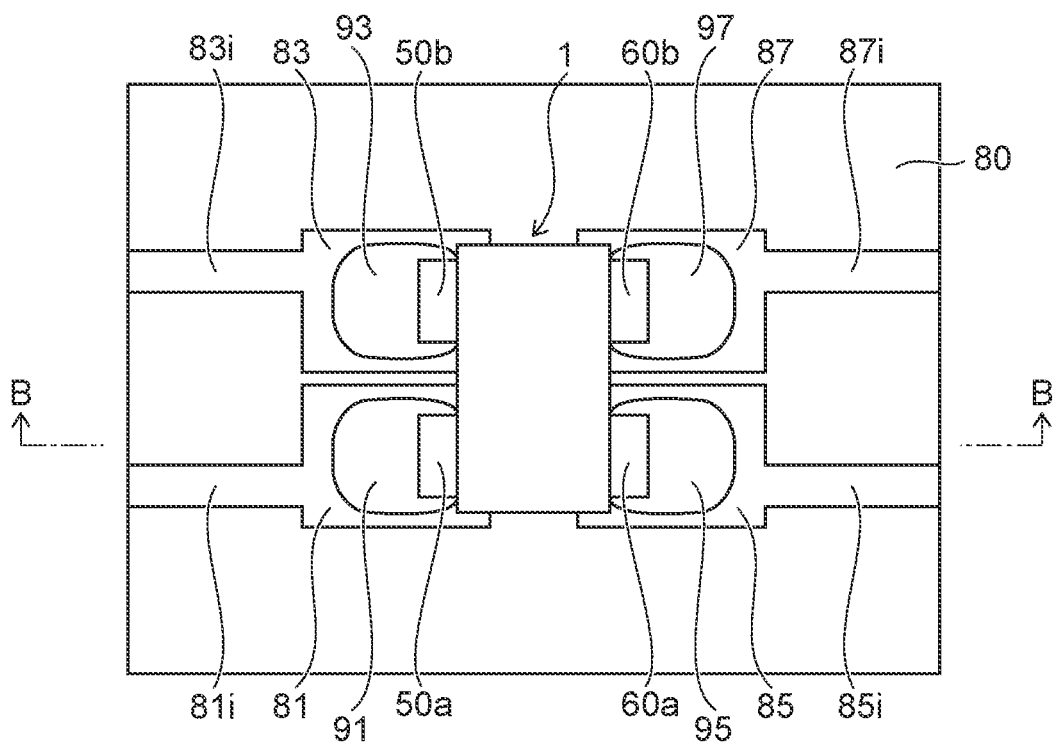

FIGS. 3A and 3B are schematic cross-sectional views showing the electronic device 1 according to the first embodiment. FIGS. 3A and 3B are schematic cross-sectional views illustrating the mounted configuration of the electronic device 1.

FIG. 3A is a cross-sectional view along line B-B shown in FIG. 3B. The first inductor chip Ci1 and the second inductor chip Ci2 are not illustrated in FIG. 3A.

As shown in FIG. 3A, the electronic device 1 is mounted in a horizontal orientation on a circuit board 80. For example, the direction from the second external terminal 60 toward the first external terminal 50 is parallel to the upper surface of the circuit board 80. The first external terminal 50 is connected to a mount pad 81 via a connection member 91, e.g., a solder material. The second external terminal 60 is connected to a mount pad 85 via a connection member 95, e.g., a solder material.

As shown in FIG. 3B, the electronic device 1 is mounted via the connection members 91, 93, 95, and 97 such as solder materials, etc., on the mount pads 81, 83, 85, and 87 provided on the circuit board 80. The electronic device 1 includes, for example, a first external terminal 50a, a first external terminal 50b, a second external terminal 60a, and a second external terminal 60b. Although one of the first external terminal 50a or 50b is described as the first external terminal 50 for convenience in the specification, the first coil 15 and the second coil 25 each are connected to one pair of external terminals. This is similar for the other components in connection with the first and second coils 15 and 25.

The first external terminal 50a is electrically connected to the first connection terminal 17a of the first inductor chip Ci1 (referring to FIG. 2B) via the first connection conductor 30 (referring to FIG. 1). Also, the first external terminal 50a is electrically connected to an interconnect 81i via the connection member 91 and the mount pad 81.

The first external terminal 50b is electrically connected to the first connection terminal 17b (not illustrated) of the first inductor chip Ci1 via another first connection conductor (not-illustrated). Also, the first external terminal 50b is electrically connected to an interconnect 83i via the connection member 93 and the mount pad 83.

The first coil 15 of the first inductor chip Ci1 is electrically connected to the interconnect 81i and the interconnect 83i via the first external terminals 50a and 50b. Also, the first coil 15 is electrically connected to a primary side circuit (not-illustrated) via the interconnect 81i and the interconnect 83i.

The second external terminal 60a is electrically connected to a second connection terminal 27a of the second inductor chip Ci2 (referring to FIG. 1) via the second connection conductor 40 (referring to FIG. 1). Also, the second external terminal 60a is electrically connected to an interconnect 85i via the connection member 95 and the mount pad 85.

The second external terminal 60b is electrically connected to a second connection terminal 27b (not illustrated) of the second inductor chip Ci2 via another second connection conductor (not-illustrated). Also, the second external terminal 60b is electrically connected to an interconnect 87i via the connection member 97 and the mount pad 87.

The second coil 25 of the second inductor chip Ci2 is electrically connected to the interconnect 85i and the interconnect 87i via the second external terminals 60a and 60b. Also, the second coil 25 is electrically connected to a secondary side circuit (not-illustrated) via the interconnect 85i and the interconnect 87i.

Thus, the electronic device 1 includes one pair of first external terminals 50 electrically connected to the first coil 15, and the other pair of second external terminals 60 electrically connected to the second coil 25. In the description hereinbelow, only one of the pair of terminals is mentioned for convenience, which are connected to each of the first and second coils 15 and 25, and a description of the other is omitted.

A method for manufacturing the electronic device 1 will now be described with reference to FIGS. 4A to 5C. FIGS. 4A to 5C are schematic cross-sectional views showing manufacturing processes of the electronic device 1 according to the first embodiment.

Figure 4A:
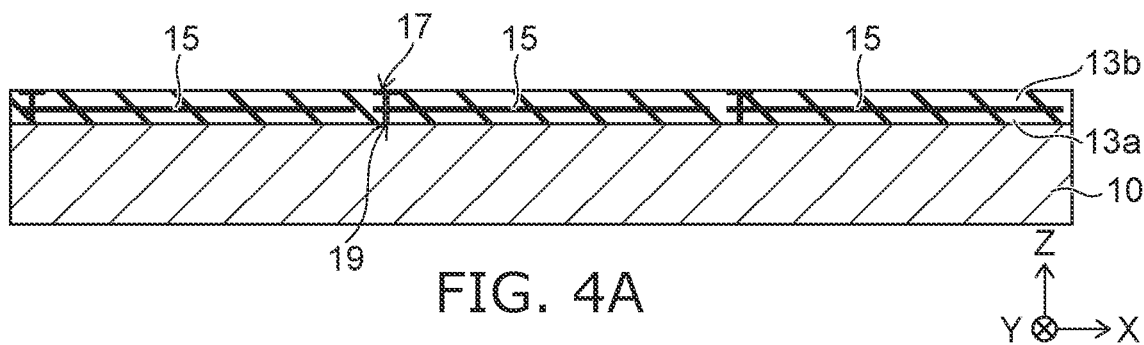
FIGS. 4A to 5C are schematic cross-sectional views showing manufacturing processes of the electronic device according to the first embodiment.

As shown in FIG. 4A, multiple first coils 15 are formed on the first substrate 10. For example, the first coil 15 is formed using a semiconductor wafer processing method. After the insulating film 13a is formed on the first substrate 10, for example, the first coil 15 is formed by filling a copper material into a spiral-shaped recess formed in an insulating film 13a. The first connection terminal 17 is formed after forming an insulating film 13b to bury the first coil 15.

The insulating films 13a and 13b are, for example, silicon oxide films and are formed using CVD (Chemical Vapor Deposition). The first coil 15 is formed, for example, using plating. Hereinbelow, the first insulating film 13 includes the insulating films 13a and 13b which are joined together.

Figure 4B:
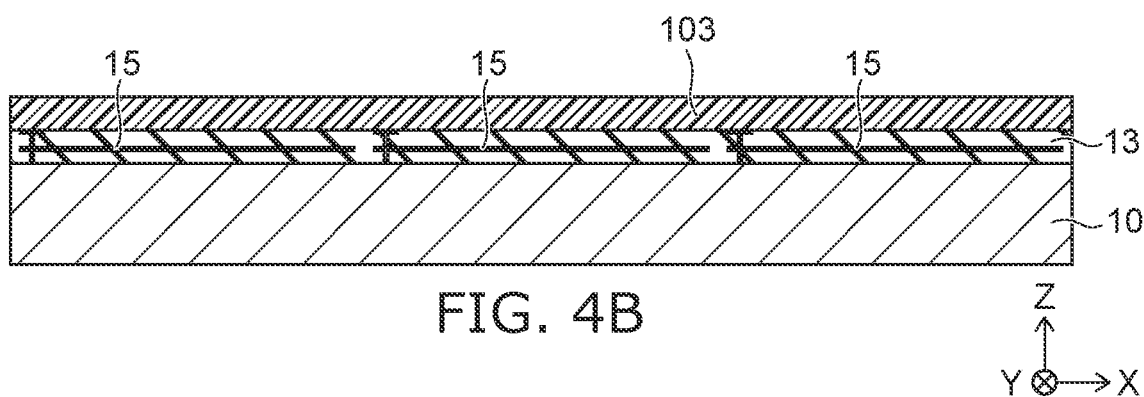

As shown in FIG. 4B, a resin sheet 103 is adhered on the first insulating film 13. The resin sheet 103 is, for example, a dicing sheet.

Figure 4C:
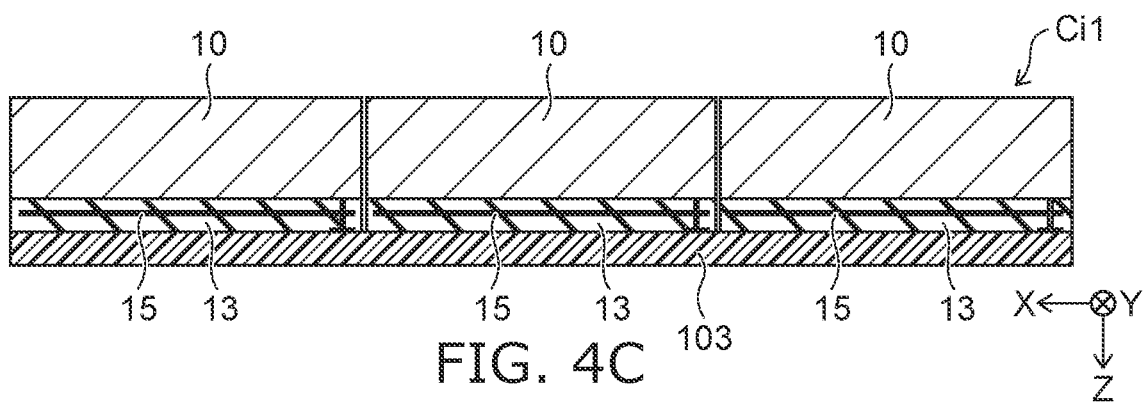

As shown in FIG. 4C, the multiple first inductor chips Ci1 are formed by dividing the first substrate 10 and the first insulating film 13 on the resin sheet 103. For example, the first substrate 10 and the first insulating film 13 are cut using a dicing blade from the back surface side of the first substrate 10.

Figure 4D:
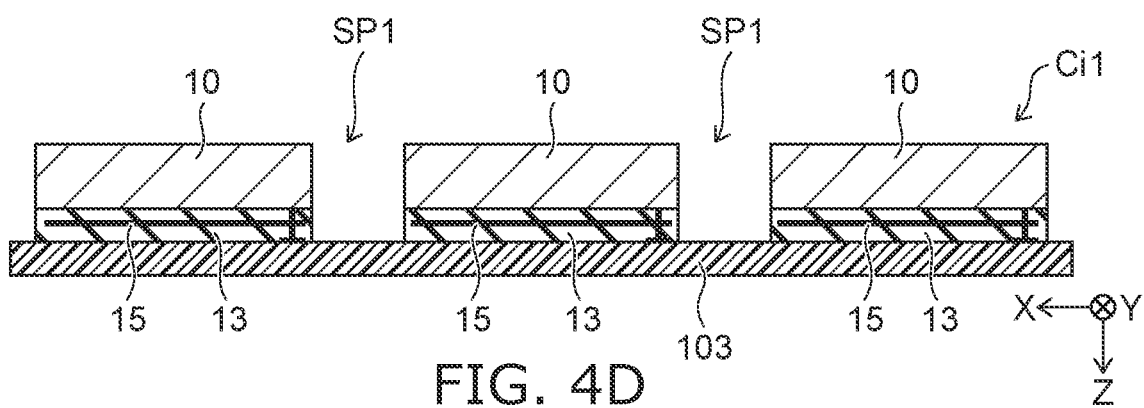

As shown in FIG. 4D, a space SP1 is provided between the adjacent first inductor chips Ci1 by expanding the resin sheet 103.

Figure 5A:
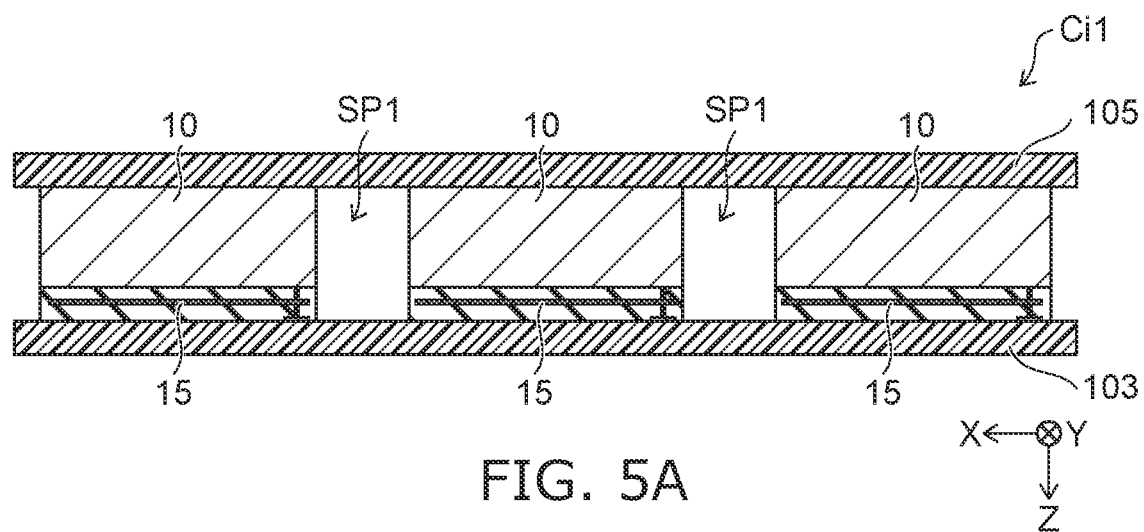

As shown in FIG. 5A, a resin sheet 105 is adhered to the back surface of the first substrate 10 while the multiple first inductor chips Ci1 are held on the resin sheet 103.

Figure 5B:
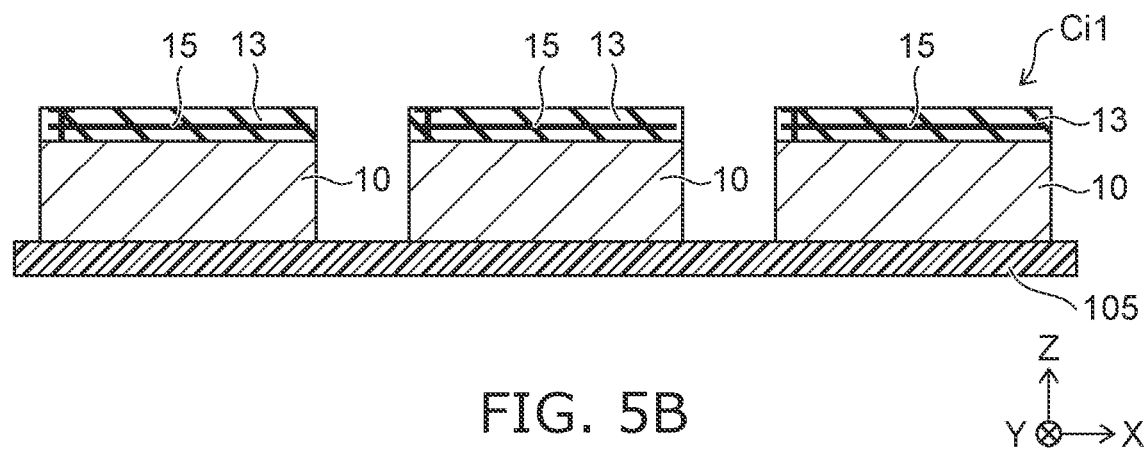

As shown in FIG. 5B, the surface of the first insulating film 13 is exposed at each of the multiple first inductor chips Ci1 by peeling the resin sheet 103. Continuing, the surfaces of the first insulating films 13 are cleaned by, for example, oxygen plasma, etc., while the multiple first inductor chips Ci1 are held on the resin sheet 105. Thereby, organic substances such as the pressure sensitive adhesive are removed, which are adhered to the surfaces of the first insulating films 13 and like.

Figure 5C:
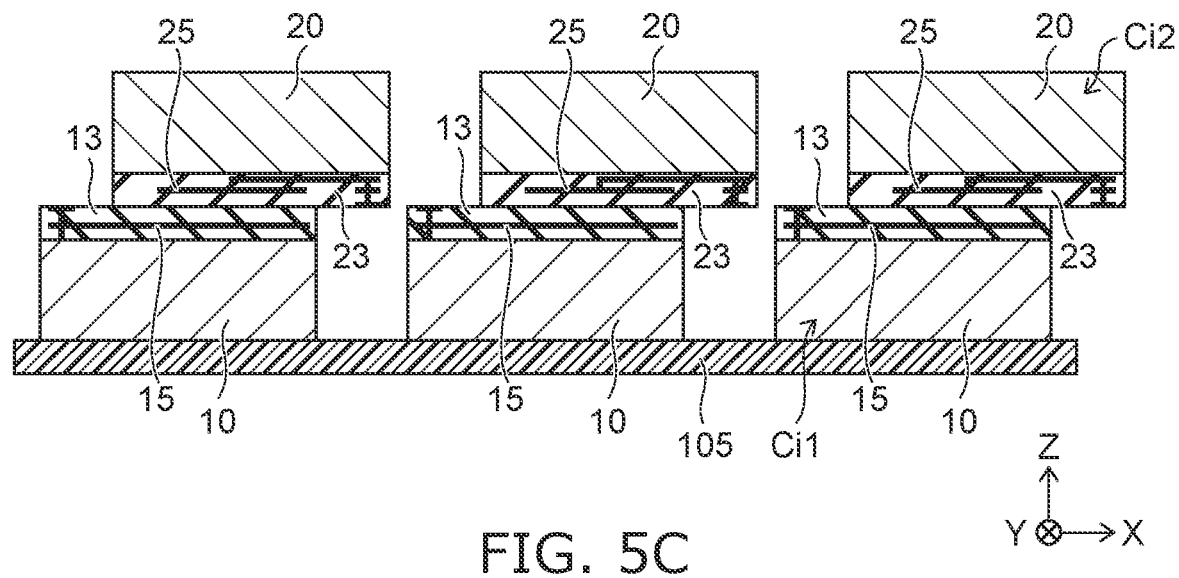

As shown in FIG. 5C, the second inductor chips Ci2 are bonded respectively to the multiple first inductor chips Ci1.

The second inductor chip Ci2 is connected to the first inductor chip Ci1 so that the first coil 15 and the second coil 25 are magnetically coupled. For example, the second inductor chips Ci2 are formed separately through the processes of FIGS. 4A to 4D.

The first inductor chip Ci1 and the second inductor chip Ci2 are bonded by causing the first insulating film 13 and the second insulating film 23 to contact each other. The first connection terminal 17 and the second connection terminal 27 (referring to FIG. 1) are exposed by bonding so that the second inductor chip Ci2 is shifted in the horizontal direction with respect to the first inductor chip Ci1.

Figure 6:
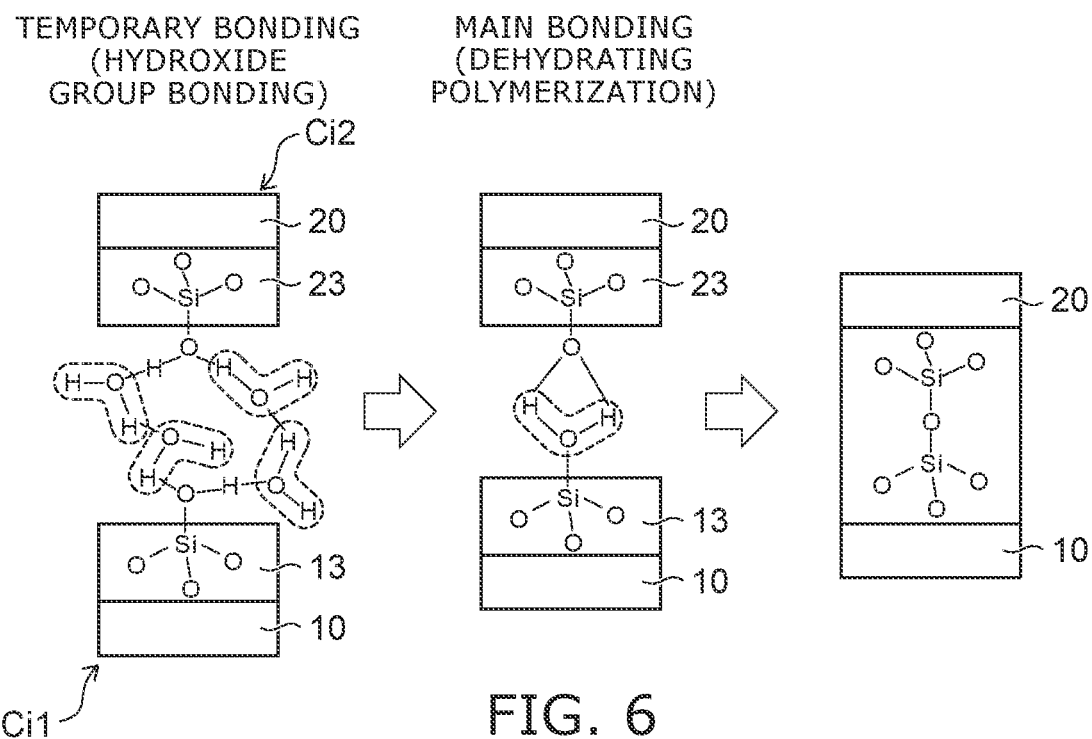
FIG. 6 is a schematic cross-sectional view showing the method for manufacturing the electronic device according to the first embodiment.

FIG. 6 is a schematic cross-sectional view showing the method for manufacturing the electronic device 1 according to the first embodiment. FIG. 6 is a schematic view showing the bonding method between the first insulating film 13 and the second insulating film 23.

As shown in FIG. 6, for example, the bonding between the first insulating film 13 and the second insulating film 23 is performed by a two-stage process of a temporary bonding and a main bonding. In other words, the first insulating film 13 and the second insulating film 23 are temporarily bonded via hydroxide groups linked to dangling bonds at the surfaces of the first and second insulating films 13 and 23. Continuing, the hydroxide is removed as moisture by heat treatment, and the dangling bonds of the first insulating film 13 and the dangling bonds of the second insulating film 23 are polymerized via oxygen (the main bonding).

FIGS. 7A to 7F are schematic cross-sectional views showing another manufacturing process of the electronic device 1 according to the first embodiment. FIGS. 7A to 7F illustrate processes of bonding the second inductor chip Ci2 to the first inductor chip Ci1.

Figure 7A:
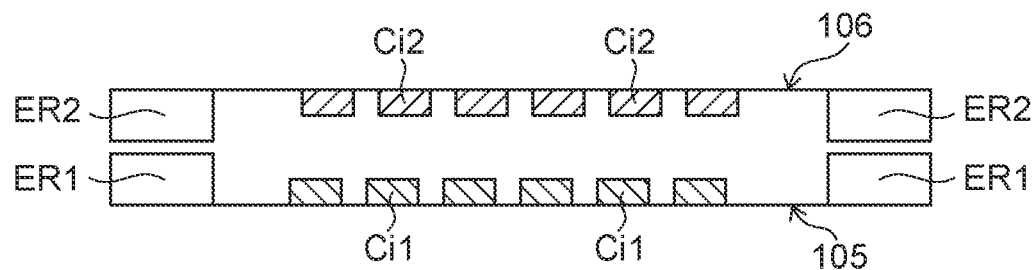
FIGS. 7A to 7F are schematic cross-sectional views showing another manufacturing process of the electronic device according to the first embodiment.

As shown in FIG. 7A, the second inductor chips Ci2 that are held on a resin sheet 106 are disposed to face the first inductor chips Ci1 held on the resin sheet 105. The first inductor chips Ci1 each have a back surface attached to the resin sheet 105. The second inductor chips each have a back surface attached to the resin sheet 106. The resin sheets 105 and 106 are held respectively by expansion rings ER1 and ER2.

The second inductor chips Ci2 are disposed such that the second insulating films 23 face the first insulating films 13 of the first inductor chips Ci1, respectively. For example, plasma activation processing is performed for the surfaces of the first insulating films 13 and the surfaces of the second insulating films 23. For example, by exposing the surfaces of the first insulating films 13 and the surfaces of the second insulating films 23 to plasma-excited argon or oxygen, the foreign matter is removed at the surfaces, and the dangling bonds of the surface atoms are activated.

The second inductor chips Ci2 are respectively located at prescribed relative positions with respect to the first inductor chips Ci1. For example, the second inductor chip Ci2 to be bonded is moved to a prescribed position above the first inductor chip Ci1 by an alignment mechanism adjusting the position of the expansion ring ER1 (not-illustrated).

Figure 7B:
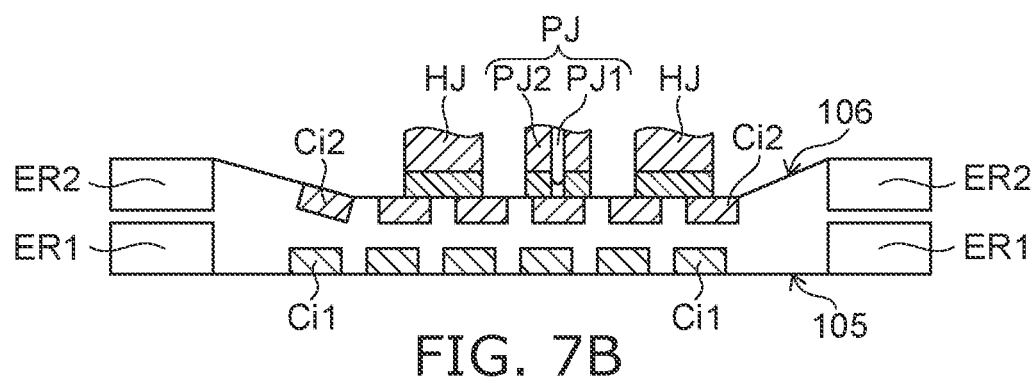

As shown in FIG. 7B, a pressing mechanism HJ and a compression bonding mechanism PJ press the resin sheet 106 down at the side opposite to the surface holding the second inductor chips Ci2, and make the spacing narrow between the second inductor chips Ci2 and the first inductor chips Ci1.

The compression bonding mechanism PJ is provided at the center of the pressing mechanism HJ For example, the pressing mechanism HJ narrows the spacing between the first inductor chip Ci1 and the second inductor chip Ci2 by pressing the back surface side of the second inductor chip Ci2. The compression bonding mechanism PJ applies pressure to the back surface of the second inductor chip Ci2 to be bonded. The compression bonding mechanism PJ includes a press pin PJ1 and a presser PJ2. The tip of the press pin PJ1 is positioned at the center of the presser PJ2 and has a smaller surface area than the chip size of the second inductor chip Ci2.

Figure 7C:
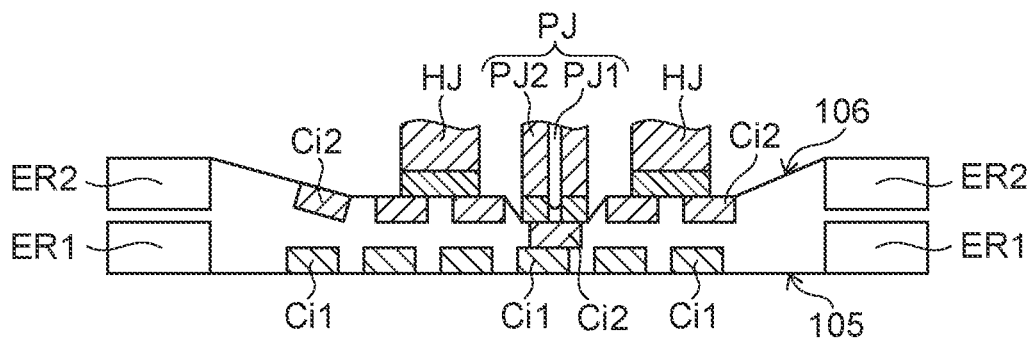

As shown in FIG. 7C, the compression bonding mechanism PJ moves downward further with respect to the pressing mechanism HJ, thereby the second inductor chip Ci2, which is to be bonded, contacts the first inductor chip Ci1. For example, at the lower surface of the compression bonding mechanism PJ that contacts the resin sheet 106, the tip of the press pin PJ1 is positioned at a higher level than the lower surface of the presser PJ2.

The first insulating film 13 and the second insulating film 23 are temporarily bonded by making the first inductor chip Ci1 and the second inductor chip Ci2 contact to each other. For example, the activated surfaces of the first insulating film 13 and the second insulating film 23 are bonded via hydrogen bonds between hydroxide groups and water molecules.

Figure 7D:
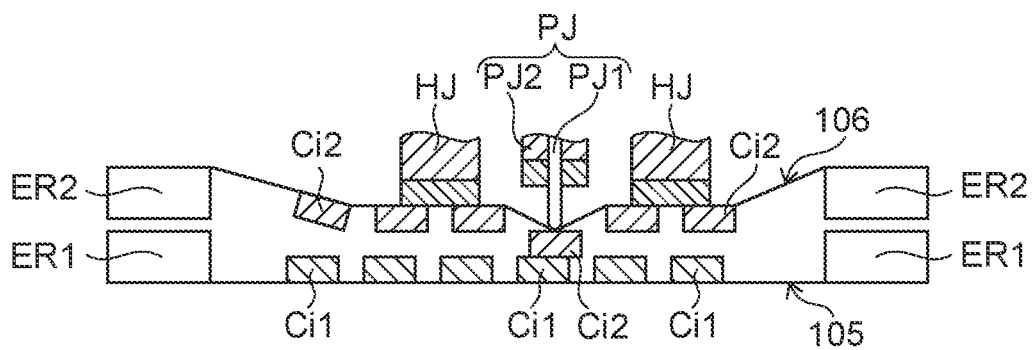

As shown in FIG. 7D, the presser PJ2 of the compression bonding mechanism PJ is raised after lowering the press pin PJ1 to press the second inductor chip Ci2 that is to be bonded. Thereby, the resin sheet 106 is peeled from the back surface of the second inductor chip Ci2 other than the portion pressed by the tip of the press pin PJ1.

Figure 7E:
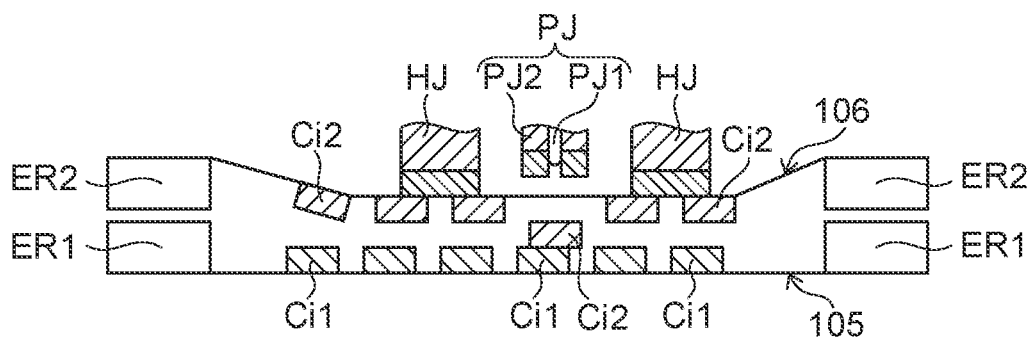

As shown in FIG. 7E, the second inductor chip Ci2 is released from the pressing by raising the press pin PJ1 of the compression bonding mechanism PJ. The resin sheet 106 is peeled from the second inductor chip Ci2 by the tension of the resin sheet 106. At this time, the resin sheet 106 can be peeled easily without the temporary bond separated between the first inductor chip Ci1 and the second inductor chip Ci2, because the resin sheet 106 has been peeled from the back surface of the second inductor chip Ci2 other than the portion pressed by the tip of the press pin PJ1.

Figure 7F:
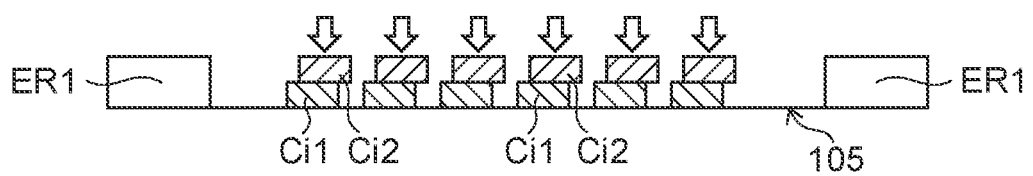

As shown in FIG. 7F, the second inductor chips Ci2 are bonded on all of the first inductor chips Ci1 by repeating the bonding process described above. Subsequently, the main bonding of the first inductor chips Ci1 and the second inductor chips Ci2 is performed by heat treatment while pressing the back surfaces of the second inductor chips Ci2. The resin sheet 105 that holds the first inductor chips Ci1 and the second inductor chips Ci2 in the temporary bonding state is placed, for example, on a hotplate, and the moisture is removed from the bonding interface between the first insulating film 13 and the second insulating film 23 by performing heat treatment at a temperature of not more than 250° C.

Thus, a magnetic coupler can be easily obtained by directly bonding the first insulating film 13 and the second insulating film 23. In the embodiment, it is easy to increase the thickness of the insulating film between the first coil 15 and the second coil 25; and the breakdown voltage of the magnetic coupler can be increased.

For example, in a method in which the first coil 15 and the second coil 25 are formed in order on the substrate 10, the manufacturing processes are increased, and the manufacturing cost is increased. Also, as the insulating film between the first coil 15 and the second coil 25 is increased, the warp of the wafer due to the stress of the insulating film increases, and the manufacturing yield decreases. In other words, in the manufacturing method according to the embodiment, the manufacturing cost can be reduced and the manufacturing yield can be increased.

Also, the connections between the first external terminal 50 and the first coil 15 and between the second coil 25 and the second external terminal 60 are easier because the first connection terminal 17 and the second connection terminal 27 are exposed at the surfaces of the first and second insulating films 13 and 23.

Figure 8:
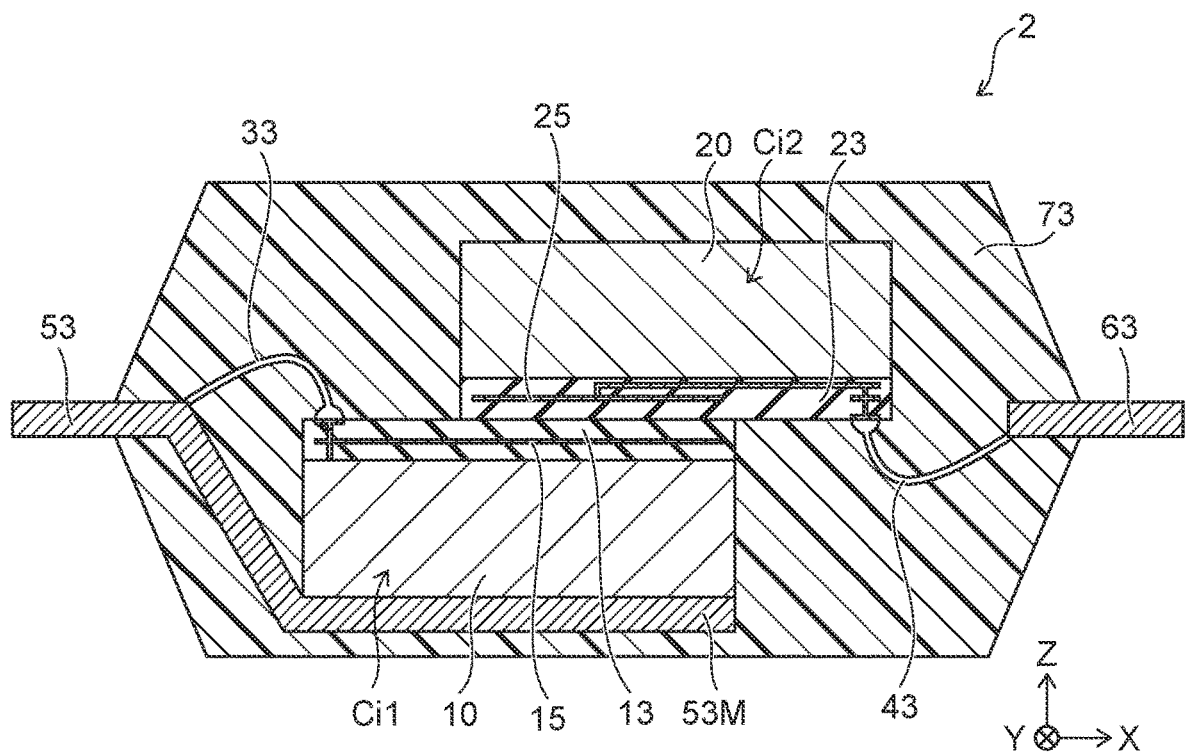
FIG. 8 is a schematic cross-sectional view showing an electronic device according to a modification of the first embodiment.

FIG. 8 is a schematic cross-sectional view showing an electronic device 2 according to a modification of the first embodiment. The electronic device 2 has a configuration in which the first inductor chip Ci1 and the second inductor chip Ci2 are bonded, and the first coil 15 and the second coil 25 are magnetically coupled.

For example, the first inductor chip Ci1 and the second inductor chip Ci2 are mounted on a lead 53M and sealed with a resin member 73. A first external terminal 53 and a second external terminal 63 are provided to extend from the resin member 73. The first external terminal 53 is linked to the lead 53M. The first external terminal 53, the second external terminal 63, and the lead 53M are, for example, metal plates including copper. The resin member 73 is, for example, an epoxy resin.

For example, the back surface side of the first substrate 10 is mounted on the lead 53M. A first connection conductor 33 electrically connects the first connection terminal 17 of the first inductor chip Ci1 (referring to FIG. 1) and the first external terminal 53. A second connection conductor 43 electrically connects the second connection terminal 27 of the second inductor chip Ci2 (referring to FIG. 1) and the second external terminal 63.

The electronic device 2 includes a plurality of first connection terminals 17, a plurality of second connection terminals 27, a plurality of first external terminals 53, and a plurality of second external terminals 63; and each plurality is arranged in, for example, the Y-direction. The first connection terminals 17 are connected respectively to the first external terminals 53. The second connection terminals 27 are connected respectively to the second external terminals 63. The first connection conductors 33 and the second connection conductors 43 are, for example, metal wires.

Figure 9A:
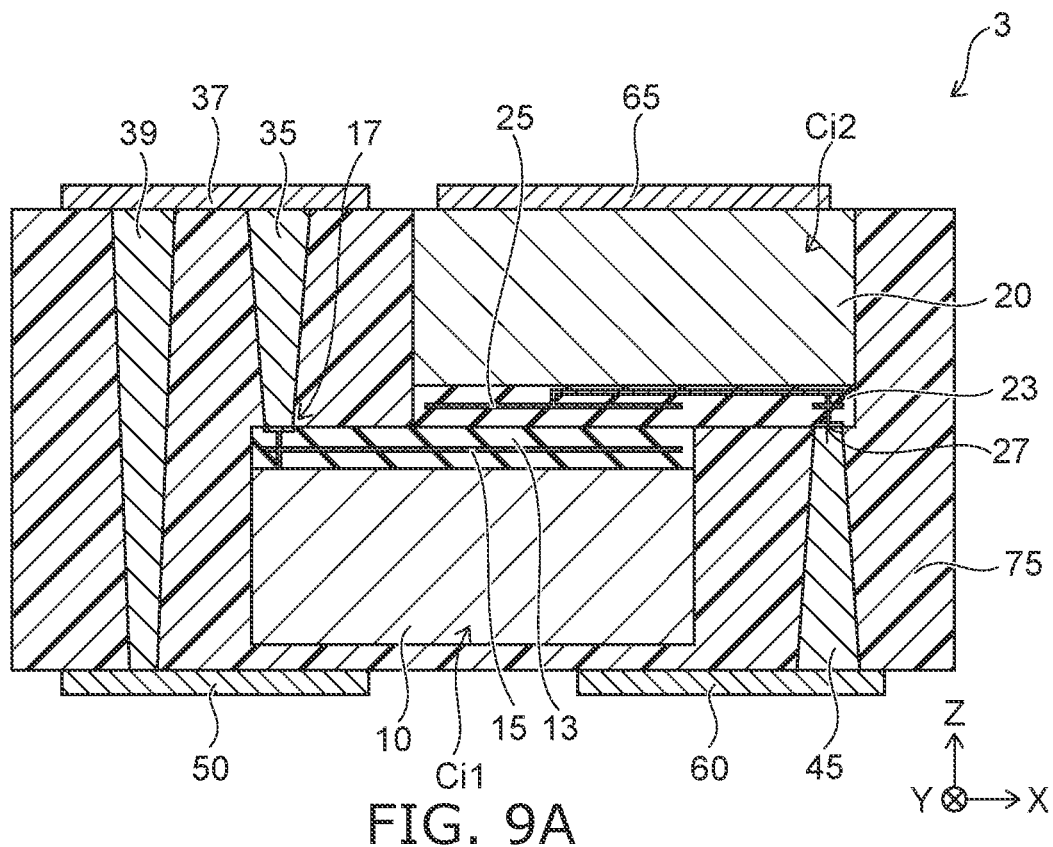
FIGS. 9A and 9B are schematic cross-sectional views showing an electronic device according to another modification of the first embodiment.
Figure 9B:
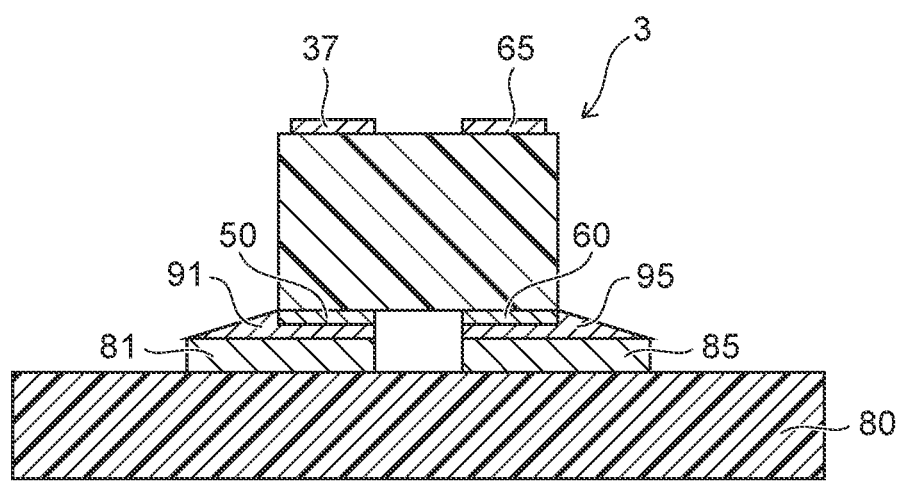

FIGS. 9A and 9B are schematic cross-sectional views showing an electronic device 3 according to another modification of the first embodiment. FIG. 9A is a schematic cross-sectional view showing the configuration of the electronic device 3. FIG. 9B is a schematic view illustrating the mounted configuration of the electronic device 3.

As shown in FIG. 9A, the electronic device 3 has a configuration in which the first inductor chip Ci1 and the second inductor chip Ci2 are bonded, and the first coil 15 and the second coil 25 are magnetically coupled. The first inductor chip Ci1 and the second inductor chip Ci2 are sealed in a resin member 75. The resin member 75 is, for example, an epoxy resin.

The electronic device 3 further includes the first external terminal 50, the second external terminal 60, a first connection conductor 35, a second connection conductor 45, a connection interconnect 37, a third connection conductor 39, and a heat dissipation plate 65.

The first connection conductor 35, the second connection conductor 45, and the third connection conductor 39 are, for example, contact plugs that include copper and extend inside the resin member 75. The first external terminal 50, the second external terminal 60, the connection interconnect 37, and the heat dissipation plate 65 are, for example, metal plates including copper and are provided on the outer surface of the resin member 75.

The resin member 75 includes, for example, an upper surface and a lower surface crossing the direction from the first inductor chip Ci1 toward the second inductor chip Ci2 (in the Z-direction). The first external terminal 50 and the second external terminal 60 are provided on the lower surface of the resin member 75. The connection interconnect 37 and the heat dissipation plate 65 are provided on the upper surface of the resin member 75.

The first connection conductor 35 extends in the Z-direction through the resin member 75 and electrically connects the connection interconnect 37 and the first connection terminal 17 of the first inductor chip Ci1. The third connection conductor 39 extends in the Z-direction through the resin member 75 and electrically connects the connection interconnect 37 and the first external terminal 50. In the example, the first external terminal 50 is electrically connected to the first connection terminal 17 via the first connection conductor 35, the connection interconnect 37, and the third connection conductor 39.

The second connection conductor 45 extends in the Z-direction through the resin member 75 and electrically connects the second external terminal 60 and the second connection terminal 27 of the second inductor chip Ci2.

As shown in FIG. 9B, the electronic device 3 is horizontally mounted on the circuit board 80. For example, the direction from the first external terminal 50 toward the second external terminal 60 (the X-direction) is parallel to the upper surface of the circuit board 80. For example, the first external terminal 50 is connected to the mount pad 81 via the connection member 91. The second external terminal 60 is connected to the mount pad 85 via the connection member 95.

Figure 21:
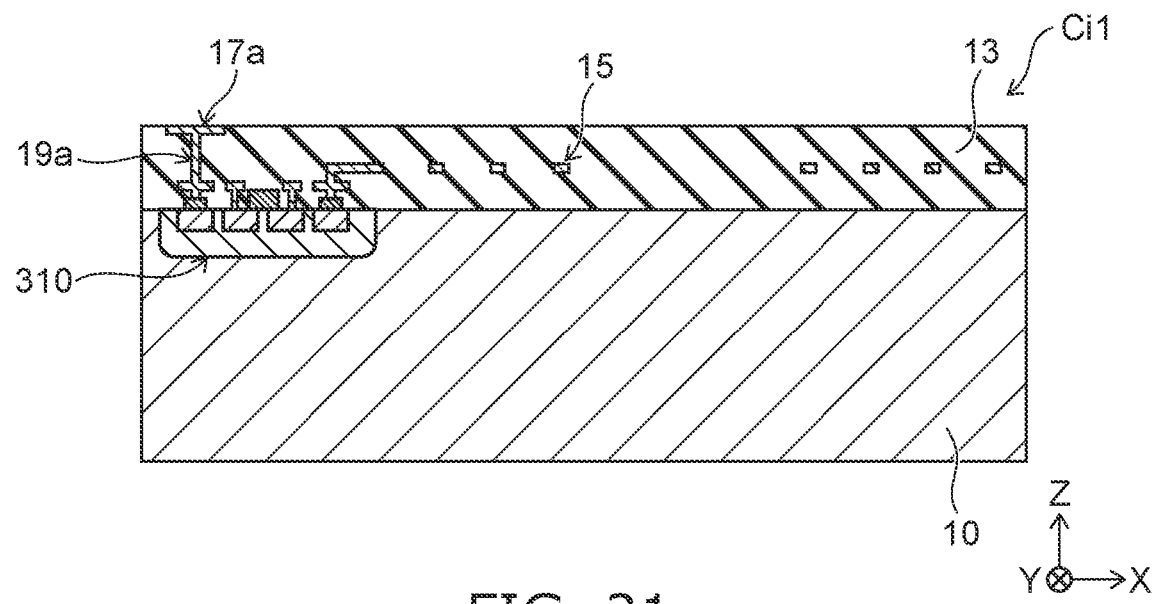
FIG. 21 is a schematic cross-sectional view showing an electronic device according to a fourth embodiment.

In the electronic devices 1 to 3, for example, the first substrate 10 and the second substrate 20 each include an electronic circuit (referring to FIG. 21). The electronic circuits are electrically connected respectively to the first and second coils 15 and 25. Also, the electronic circuits are electrically connected respectively to the external terminal 50 via the first connection conductor 30 and to the external terminal 60 via the second connection conductor 40 (referring to FIG. 1).

Another method for manufacturing the electronic devices 1 to 3 according to the first embodiment will now be described with reference to FIGS. 10A to 10D. FIGS. 10A to 10D are schematic cross-sectional views showing other manufacturing processes of the electronic devices 1 to 3.

Figure 10A:
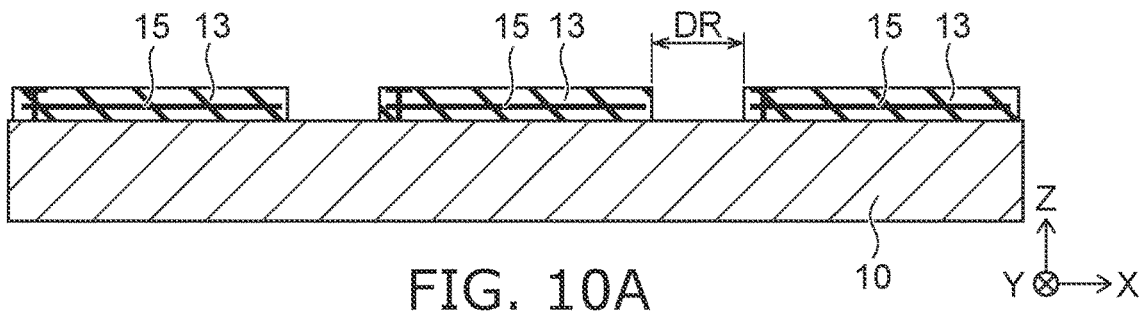
FIGS. 10A to 10D are schematic cross-sectional views showing other manufacturing processes of the electronic devices according to the first embodiment.

As shown in FIG. 10A, multiple first coils 15 are formed on the first substrate 10. The first coils 15 are formed respectively in the first insulating films 13. The first insulating films 13 are separated from each other; for example, a dicing region DR is formed between the adjacent first insulating films 13.

Figure 10B:
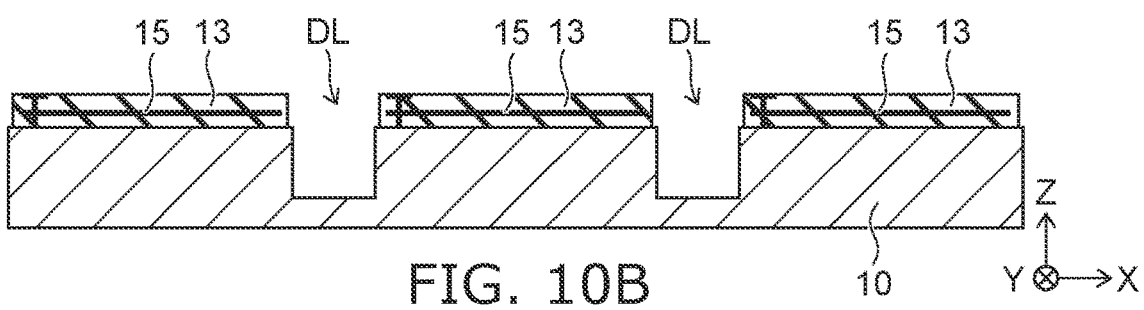

As shown in FIG. 10B, the first substrate 10 is half-cut in the dicing region DR. The first substrate 10 is partially cut using, for example, a dicing blade. The dicing line DL is formed with the trench-shape in the first substrate 10.

Figure 10C:
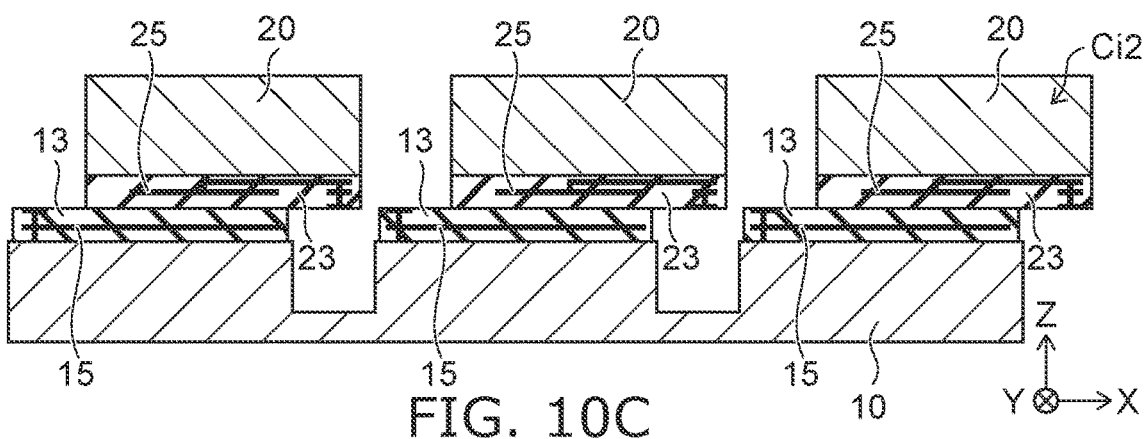

As shown in FIG. 10C, the second inductor chips Ci2 are bonded respectively to the multiple first insulating films 13. The second insulating film 23 of the second inductor chip Ci2 is directly bonded to the first insulating film 13 so that the first coil 15 and the second coil 25 are magnetically coupled. The first insulating film 13 and the second insulating film 23 are bonded using, for example, the method shown in FIG. 6.

Figure 10D:
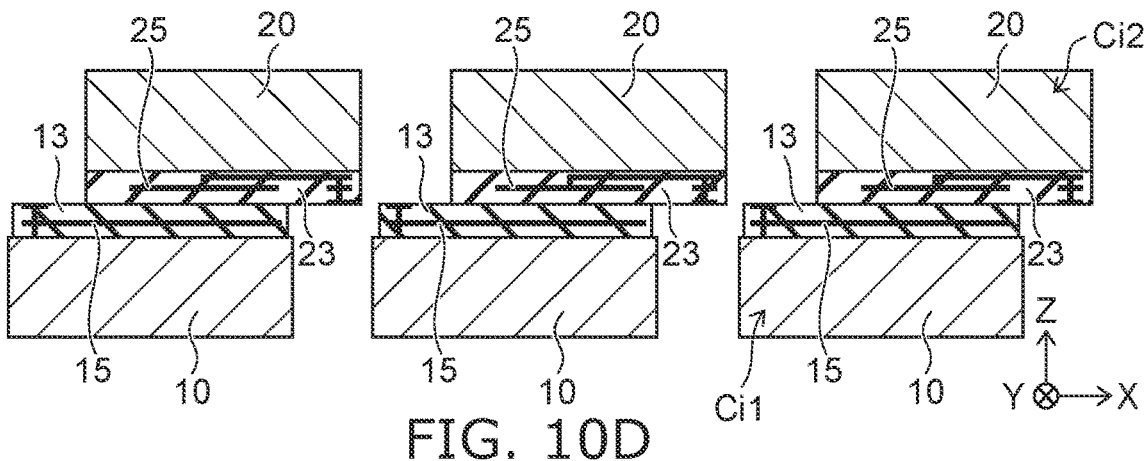

As shown in FIG. 10D, the first inductor chips Ci1 are formed by dicing the first substrate 10. For example, the first substrate 10 is thinned to a prescribed thickness by grinding or polishing the back surface side, and divided into multiple chips. In other words, the first substrate 10 is divided into multiple chips by the dicing line DL.

In the electronic devices 1 to 3 according to the first embodiment, the first coil 15 and the second coil 25 are provided between the first substrate 10 and the second substrate 20. When the first substrate 10 and the second substrate 20 are electrically conductive, the first coil 15 and the second coil 25 are shielded from external electromagnetic waves. In other words, the electronic devices 1 to 3 can be configured to prevent the disturbance due to electromagnetic waves.

Second Embodiment

Figure 11A:
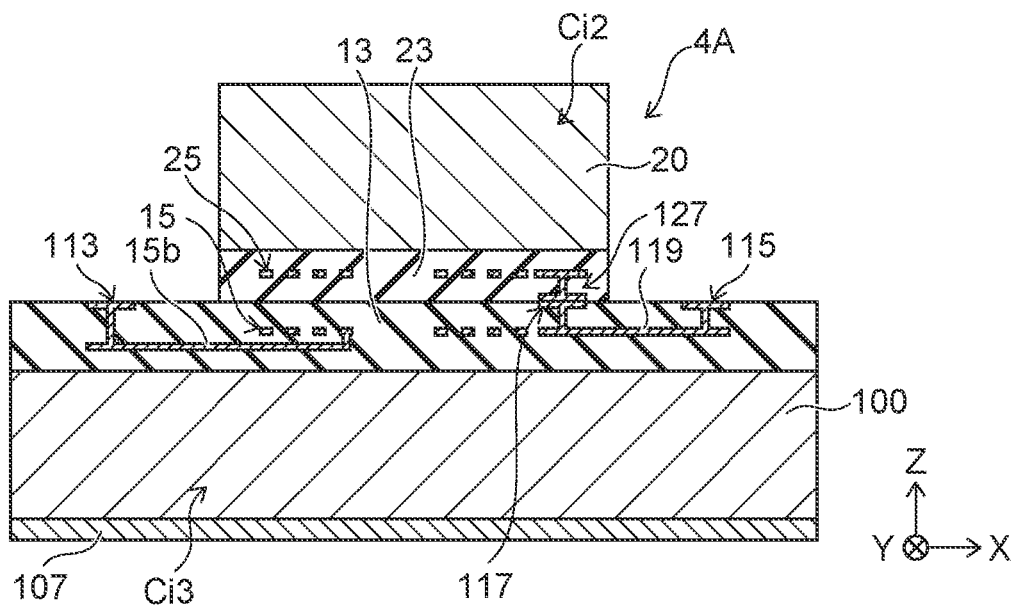
FIGS. 11A and 11B are schematic cross-sectional views showing electronic devices according to a second embodiment.
Figure 11B:
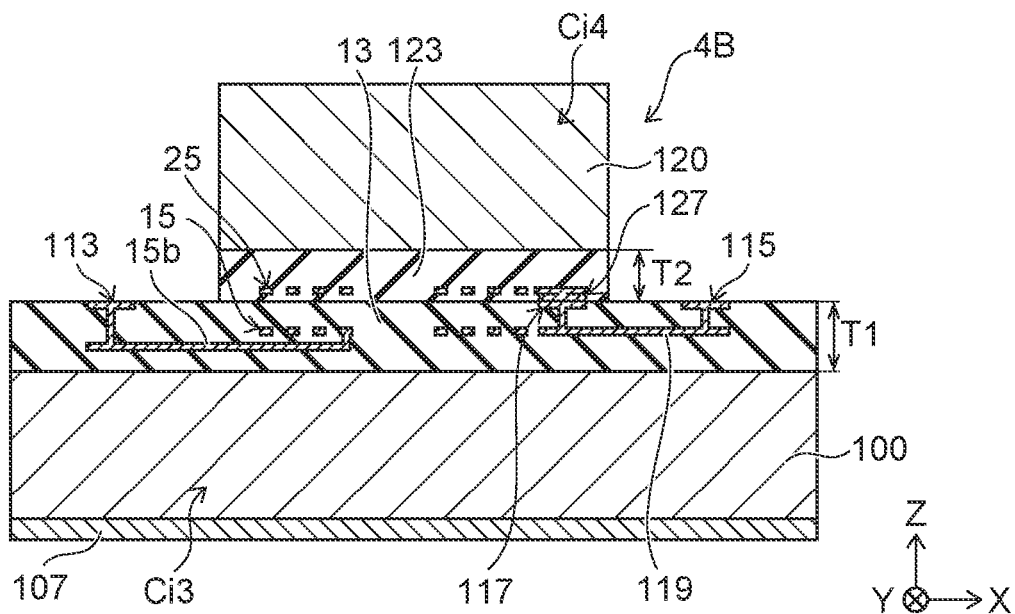

FIGS. 11A and 11B are schematic cross-sectional views showing electronic devices 4A and 4B according to the second embodiment.

As shown in FIG. 11A, the electronic device 4A has a structure in which the second inductor chip Ci2 is bonded on a third inductor chip Ci3 including the first coil 15. The electronic device 4A is configured so that the first coil 15 and the second coil 25 are magnetically coupled.

The third inductor chip Ci3 further includes the first insulating film 13, a first substrate 100, a bonding layer 107, a first connection terminal 113, a second connection terminal 115, a third connection terminal 117, and a connecting line 119.

The first substrate 100 is, for example, a silicon substrate. The first substrate 100 has a front surface, and has a back surface at a side opposite to the front surface. The first insulating film 13 is provided on the front surface of the first substrate 100. The bonding layer 107 is provided on the back surface side of the first substrate 100. The bonding layer 107 is, for example, a metal layer including titanium, nickel, gold, etc.

The first connection terminal 113 is provided at the front surface side of the first insulating film 13. The first coil 15 is provided in the first insulating film 13 and is electrically connected to the first connection terminal 113 via, for example, the connecting line 15b and the connection pad 15d (referring to FIG. 2A).

The second connection terminal 115 and the third connection terminal 117 are provided at the front surface side of the first insulating film 13. For example, the second connection terminal 115 and the third connection terminal 117 are electrically connected via the connecting line 119. The third connection terminal 117 is provided between the first connection terminal 113 and the second connection terminal 115. The first connection terminal 113, the second connection terminal 115, the third connection terminal 117, and the connecting line 119 include, for example, copper. The connecting line 119 includes, for example, the same material as the first coil 15.

The second inductor chip Ci2 is provided on the third inductor chip Ci3 by bonding the first insulating film 13 and the second insulating film 23. Another second connection terminal 127 and the third connection terminal 117 are bonded between the second inductor chip Ci2 and the third inductor chip Ci3. The second coil 25 is electrically connected to the second connection terminal 115 of the third inductor chip Ci3 via the other second connection terminal 127, the third connection terminal 117, and the connecting line 119.

The first connection terminal 113 and the second connection terminal 115 are exposed at the front surface of the first insulating film 13 outside the region where the first insulating film 13 and the second insulating film 23 are bonded.

In the electronic device 4B shown in FIG. 11B, a fourth inductor chip Ci4 that includes the second coil 25 is bonded on the third inductor chip Ci3. The electronic device 4B also is configured so that the first coil 15 and the second coil 25 are magnetically coupled.

The fourth inductor chip Ci4 includes a second substrate 120 and a second insulating film 123. The second substrate 120 is, for example, a silicon substrate. The second insulating film 123 is provided on the second substrate 120 and includes the second coil 25. The second insulating film 123 is, for example, a silicon oxide film. The second insulating film 123 includes a back surface contacting the second substrate 120, and a front surface at the side opposite to the back surface. The second coil 25 is electrically connected to the second connection terminal 127 provided at the front surface side of the second insulating film 123.

The fourth inductor chip Ci4 is provided on the third inductor chip Ci3 by bonding the first insulating film 13 and the second insulating film 123. The second connection terminal 127 and the third connection terminal 117 are bonded between the fourth inductor chip Ci4 and the third inductor chip Ci3.

In the example, the first insulating film 13 of the third inductor chip Ci3 has a thickness T1 in the Z-direction. The second insulating film 123 of the fourth inductor chip Ci4 has a thickness T2 in the Z-direction. For example, the second insulating film 123 is configured such that the thickness T2 is different from the thickness T1. For example, the thickness T2 in the Z-direction of the second insulating film 123 is less than the thickness T1 in the Z-direction of the first insulating film 13.

Figure 12A:
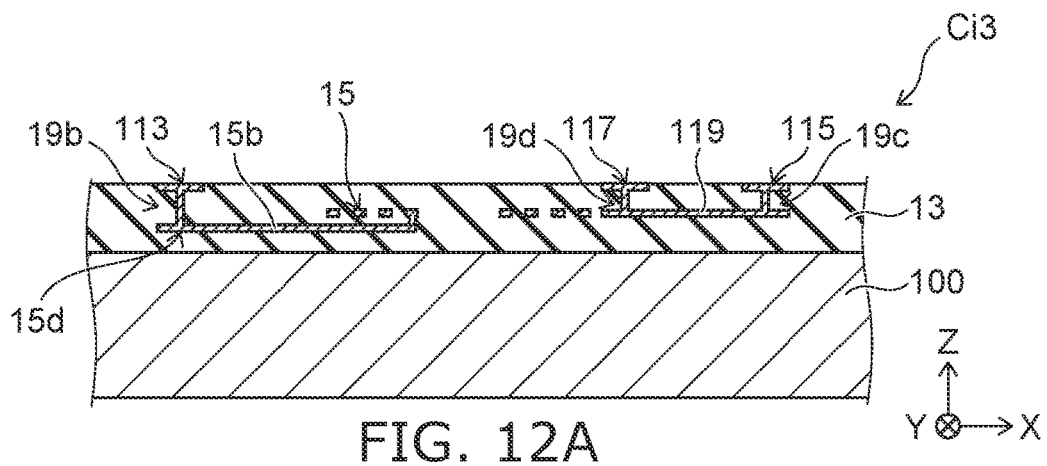
FIGS. 12A to 12C are schematic cross-sectional views showing manufacturing processes of the electronic device according to the second embodiment.
Figure 12B:
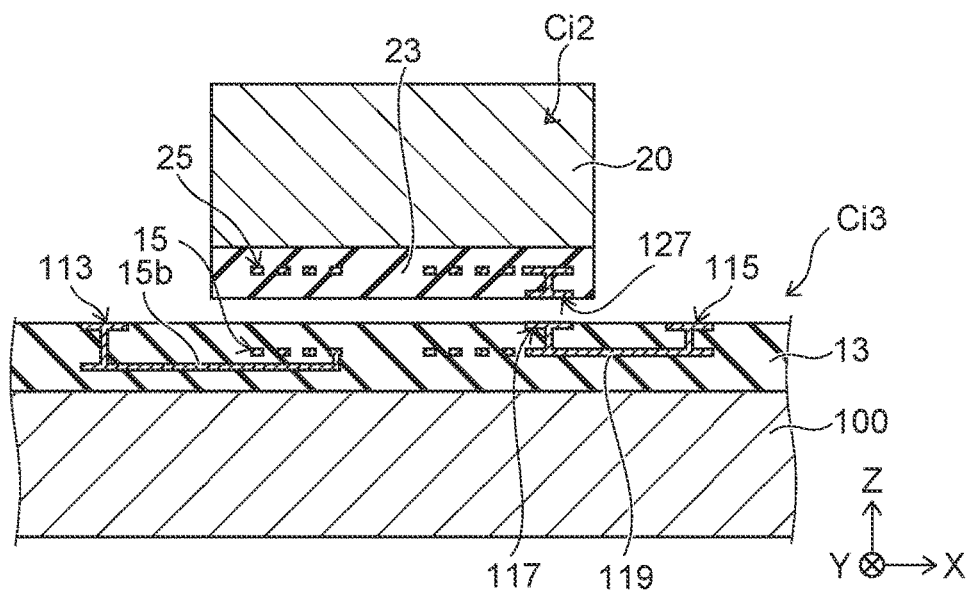
Figure 12C:
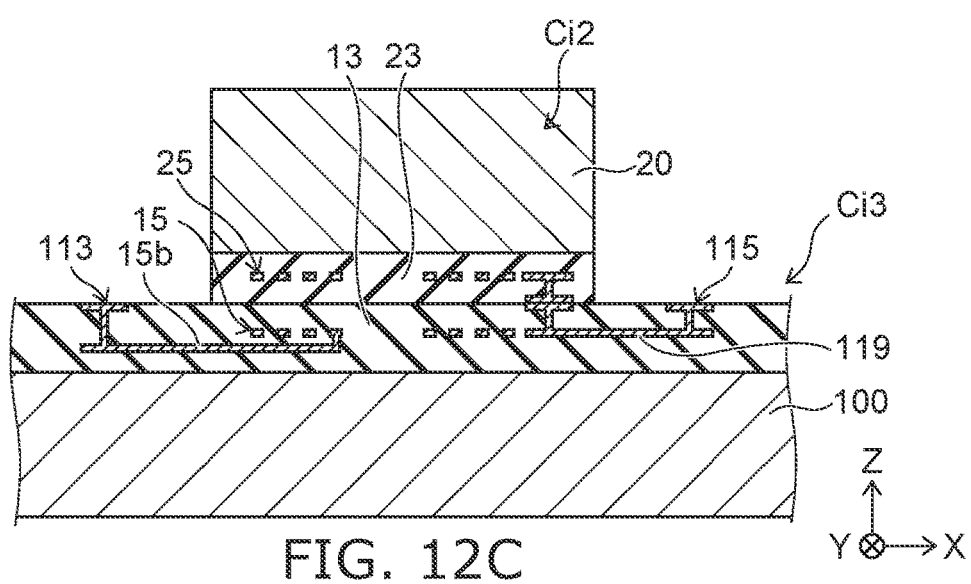

A method for manufacturing the electronic devices 4A and 4B according to the second embodiment will now be described with reference to FIGS. 12A to 12C. FIGS. 12A to 12C are schematic cross-sectional views showing manufacturing processes of the electronic device 4A. The electronic device 4B is similarly formed.

As shown in FIG. 12A, the first insulating film 13 that includes the first coil 15 and the connecting line 119 is formed on the first substrate 100. The first connection terminal 113, the second connection terminal 115, and the third connection terminal 117 are formed on the first insulating film 13.

For example, the first connection terminal 113 is electrically connected to the connection pad 15d of the first coil 15 via the contact plug 19b (referring to FIG. 2A). The first coil 15 is electrically connected to the first connection terminal 113 via the contact plug 19b.

For example, the second connection terminal 115 is electrically connected to the connecting line 119 via a contact plug 19c. For example, the third connection terminal 117 is electrically connected to the connecting line 119 via a contact plug 19d.

For example, the first coil 15, the first connection terminal 113, the second connection terminal 115, the third connection terminal 117, and the connecting line 119 are formed on the first substrate 100 by using the semiconductor wafer processing method.

As shown in FIGS. 12B and 12C, the second inductor chip Ci2 and the third inductor chip Ci3 are bonded after aligning the second inductor chip Ci2 above the third inductor chip Ci3 so that the first coil 15 and the second coil 25 are magnetically coupled.

In such a case, the second inductor chip Ci2 and the third inductor chip Ci3 are bonded by both the bonding of the first insulating film 13 and the second insulating film 23 and the bonding of the second connection terminal 127 and the third connection terminal 117. The second connection terminal 127 of the second inductor chip Ci2 and the third connection terminal 117 of the third inductor chip Ci3 are metal layers each including copper; and the both can be bonded by making the cleaned surfaces contact to each other.

Continuing, the first substrate 100 and the first insulating film 13 are cut into the multiple third inductor chips Ci3 using, for example, a dicing blade.

Figure 13:
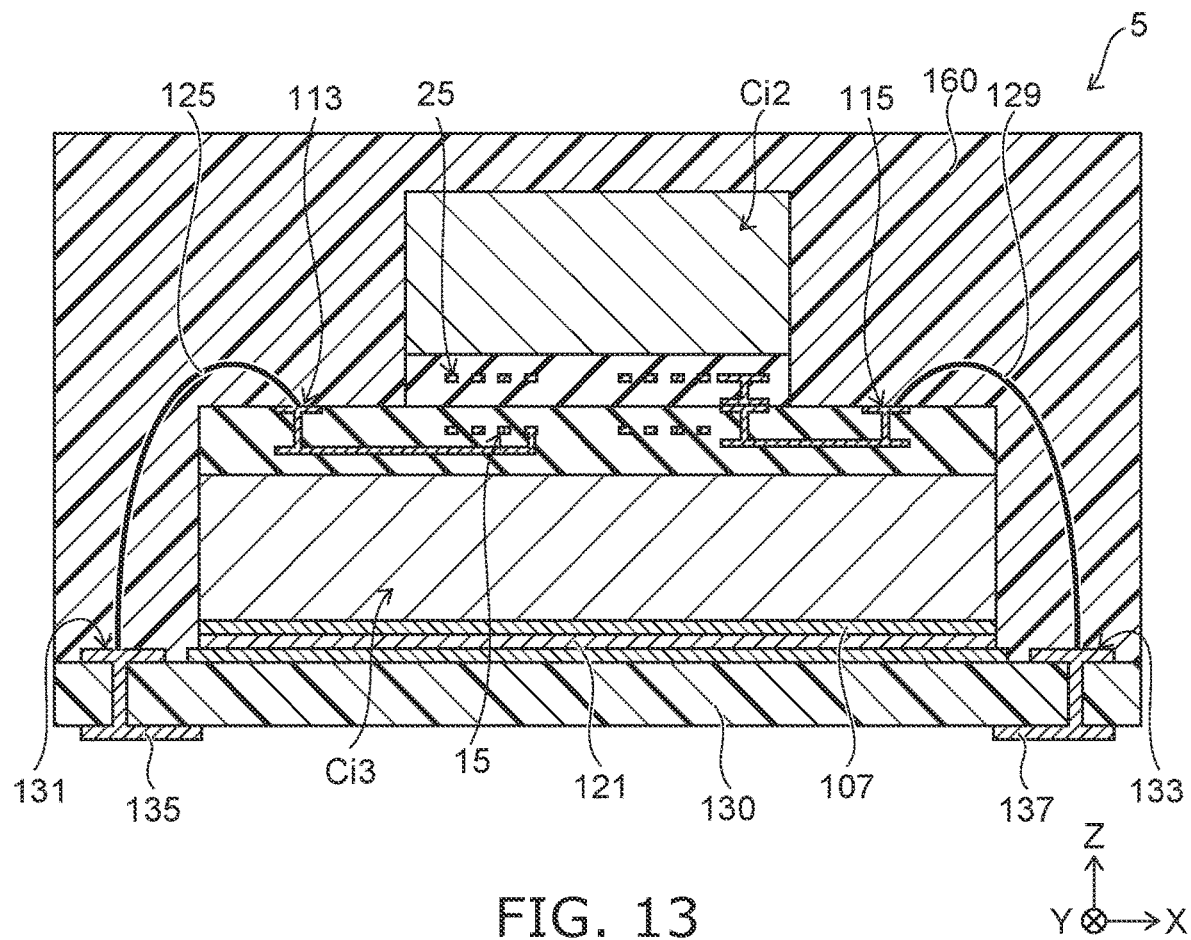
FIG. 13 is a schematic cross-sectional view showing an electronic device according to a first modification of the second embodiment.

FIG. 13 is a schematic cross-sectional view showing an electronic device 5 according to a first modification of the second embodiment. The electronic device 5 includes the second inductor chip Ci2 and the third inductor chip Ci3. The second inductor chip Ci2 and the third inductor chip Ci3 are bonded so that the first coil 15 and the second coil 25 are magnetically coupled.

For example, the third inductor chip Ci3 is mounted on a dielectric substrate 130 via the bonding layer 107 on the back surface of the third inductor chip Ci3 and a connection member 121 such as a solder material or the like. For example, the third inductor chip Ci3 is mounted on the dielectric substrate 130 after the second inductor chip Ci2 is bonded to the third inductor chip Ci3.

The dielectric substrate 130 includes bonding pads 131 and 133, a first external terminal 135, and a second external terminal 137. The dielectric substrate 130 has a front surface, and has a back surface at the side opposite to the front surface. The first external terminal 135 and the second external terminal 137 are provided at the back surface side of the dielectric substrate 130. The bonding pads 131 and 133 are provided at the front surface side of the dielectric substrate 130 where the third inductor chip Ci3 is mounted, and are electrically connected respectively to the first external terminal 135 and the second external terminal 137.

The first connection terminal 113 of the third inductor chip Ci3 is electrically connected to the bonding pad 131 via a first connection conductor 125. The second connection terminal 115 is electrically connected to the bonding pad 133 via a second connection conductor 129. The first connection conductor 125 and the second connection conductor 129 are, for example, metal wires including gold (Au), silver (Ag), or copper (Cu)

The second inductor chip Ci2, the third inductor chip Ci3, the first connection conductor 125, and the second connection conductor 129 are sealed on the dielectric substrate 130 by a resin member 160. The resin member 160 is, for example, an epoxy resin.

Also, in the example, the first coil 15 is electrically connected to the first external terminal 135 via the first connection terminal 113 and the first connection conductor 125.

The second coil 25 is electrically connected to the second external terminal 137 via the second connection terminal 115 and the second connection conductor 129.

Figure 14A:
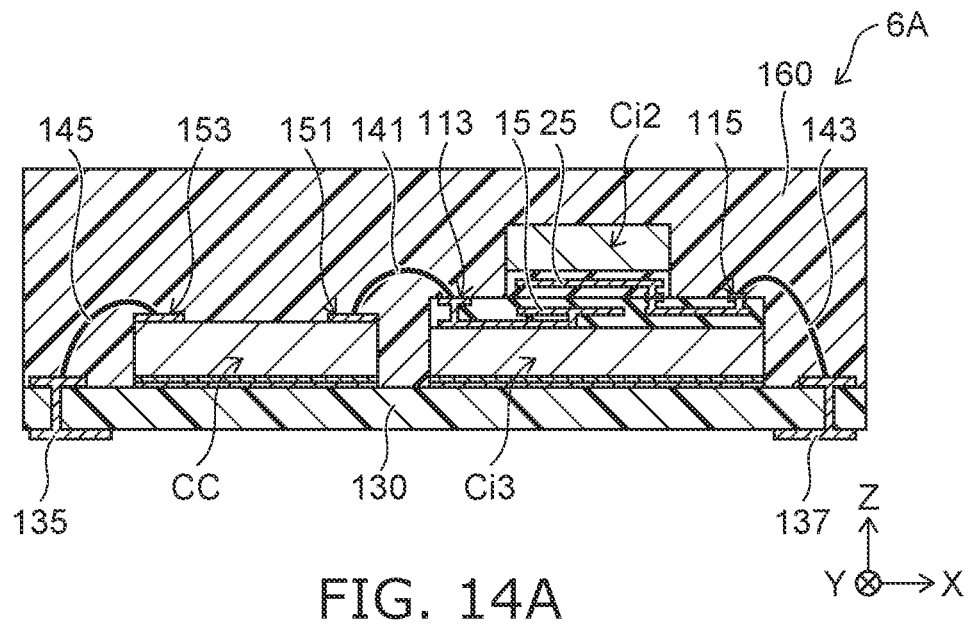
FIGS. 14A and 14B are schematic cross-sectional views showing electronic devices according to a second modification of the second embodiment.
Figure 14B:
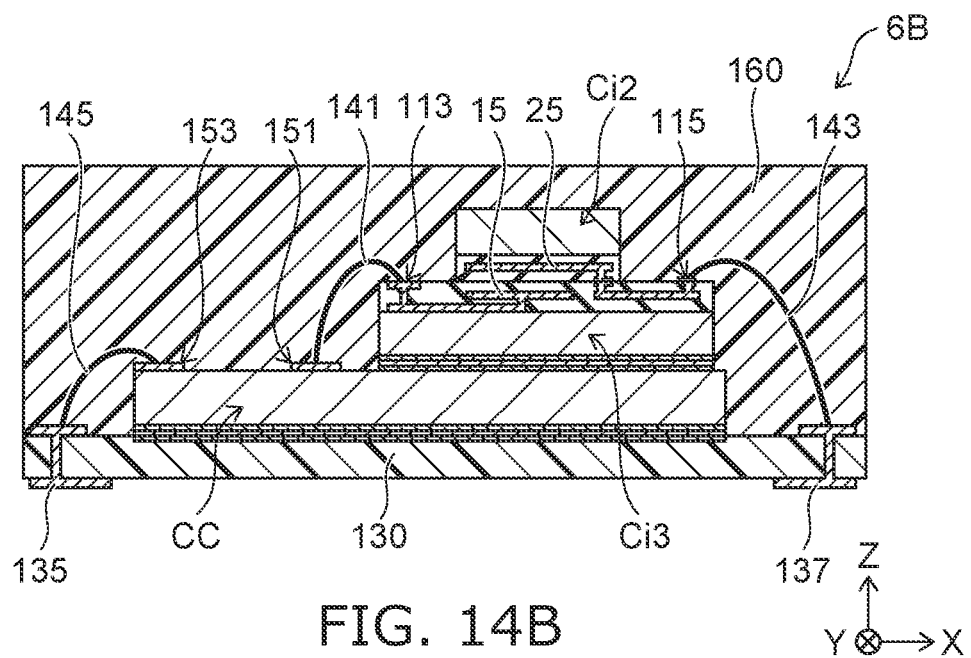

FIGS. 14A and 14B are schematic cross-sectional views showing electronic devices 6A and 6B according to a second modification of the second embodiment. The electronic devices 6A and 6B include the second inductor chip Ci2, the third inductor chip Ci3, and a control chip CC. The second inductor chip Ci2, the third inductor chip Ci3, and the control chip CC are sealed on the dielectric substrate 130 by the resin member 160. The control chip CC is, for example, a MOSFET.

In the electronic device 6A shown in FIG. 14A, the third inductor chip Ci3 and the control chip CC are mounted on the dielectric substrate 130. The second inductor chip Ci2 is bonded on the third inductor chip Ci3 so that the first coil 15 and the second coil 25 are magnetically coupled.

For example, the third inductor chip Ci3 is mounted on the dielectric substrate 130 after the second inductor chip Ci2 is bonded to the third inductor chip Ci3. The control chip CC is mounted on the dielectric substrate 130 so that the third inductor chip Ci3 and the control chip CC are arranged on the dielectric substrate 130.

The first connection terminal 113 of the third inductor chip Ci3 is electrically connected to an input terminal 151 of the control chip CC via a first connection conductor 141. The second connection terminal 115 is electrically connected to the second external terminal 137 via a second connection conductor 143. The first external terminal 135 is electrically connected to an output terminal 153 of the control chip CC via a third connection conductor 145. The first connection conductor 141, the second connection conductor 143, and the third connection conductor 145 are, for example, metal wires.

In the electronic device 6B shown in FIG. 14B, the control chip CC is mounted on the dielectric substrate 130. The third inductor chip Ci3 is mounted on the control chip CC. The second inductor chip Ci2 is bonded on the third inductor chip Ci3 so that the first coil 15 and the second coil 25 are magnetically coupled. For example, the third inductor chip Ci3 is mounted on the control chip CC after the second inductor chip Ci2 is bonded to the third inductor chip Ci3.

The first connection terminal 113 of the third inductor chip Ci3 is electrically connected to the input terminal 151 of the control chip CC via the first connection conductor 141. The second connection terminal 115 is electrically connected to the second external terminal 137 via the second connection conductor 143. The output terminal 153 of the control chip CC is electrically connected to the first external terminal 135 via the third connection conductor 145. The first connection conductor 141, the second connection conductor 143, and the third connection conductor 145 are, for example, metal wires.

In the examples described above, the input signal is input from the second external terminal 137 to the second inductor chip Ci2. The second inductor chip Ci2 is provided at the transmitting side. The input signal is transmitted via the magnetic coupling between the second coil 25 of the second inductor chip Ci2 and the first coil 15 of the third inductor chip Ci3; and a control signal that corresponds to the input signal is output from the first connection terminal 113. The control signal is input to the control chip CC; and an output signal corresponding to the input signal is output from the first external terminal 135 that is electrically connected to the control chip CC.

For example, the electronic devices 6A and 6B act as relays. For example, by using a switching element such as a MOSFET or the like as the control chip CC, the second inductor chip Ci2 is operated as the transmitting side, and the third inductor chip is operated as the receiving side. In other words, the control chip CC is controlled by the signal transmitted from the second inductor chip Ci2 to the third inductor chip Ci3, which serves as the gate input of the control chip CC. Thereby, the relay can be configured in which the input side and the output side are electrically insulated.

Figure 15:
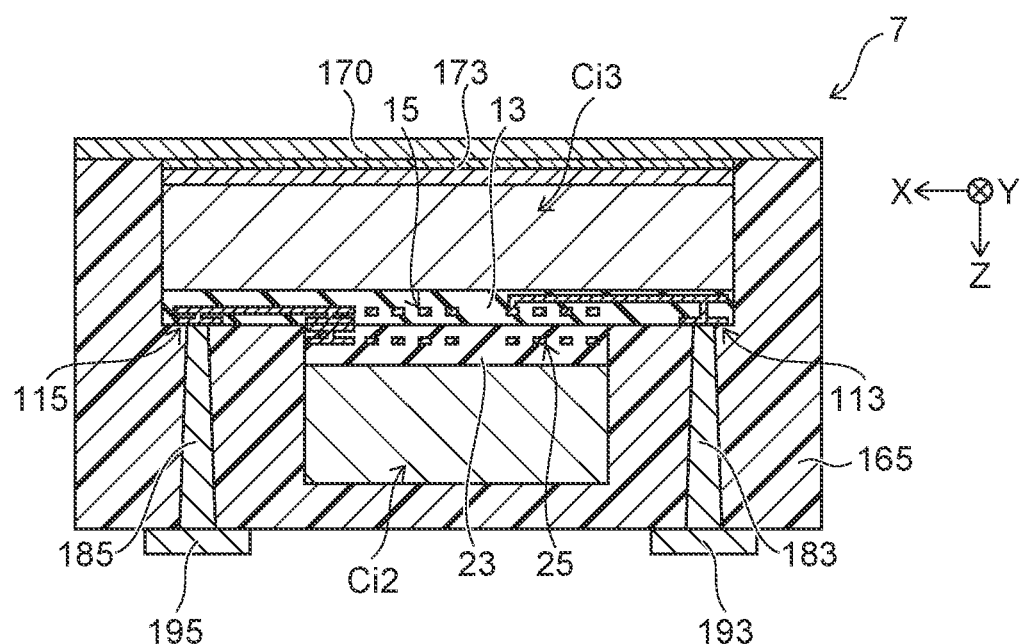
FIG. 15 is a schematic cross-sectional view showing an electronic device according to a third modification of the second embodiment.

FIG. 15 is a schematic cross-sectional view showing an electronic device 7 according to a third modification of the second embodiment. The electronic device 7 includes the second inductor chip Ci2 and the third inductor chip Ci3. The second inductor chip Ci2 and the third inductor chip Ci3 are bonded so that the first coil 15 and the second coil 25 are magnetically coupled. The second inductor chip Ci2 and the third inductor chip Ci3 are sealed with a resin member 165. The electronic device 7 further includes a base 170 for heat dissipation which is connected to the back surface of the third inductor chip Ci3.

The third inductor chip Ci3 is mounted on the base 170 via a connection member 173 after the second inductor chip Ci2 is bonded to the third inductor chip Ci3. The base 170 is, for example, a metal plate including copper, aluminum, etc. The connection member 173 is a solder material and like. The connection member 173 may be an insulative paste having a high thermal conductivity.

The resin member 165 includes, for example, a front surface that contacts the base 170, and a back surface at the side opposite to the front surface; and a first external terminal 193 and a second external terminal 195 are provided at the back surface side. The resin member 165 is molded to cover the second inductor chip Ci2 and the third inductor chip Ci3 mounted on the base 170. The resin member 165 is, for example, an epoxy resin.

A first connection conductor 183 extends in the resin member 165 and electrically connects the first external terminal 193 and the first connection terminal 113 of the third inductor chip Ci3. A second connection conductor 185 extends in the resin member 165 and electrically connects the first external terminal 195 and the second connection terminal 115 of the third inductor chip Ci3. The first connection conductor 183 and the second connection conductor 185 are, for example, contact plugs including copper.

Figure 16A:
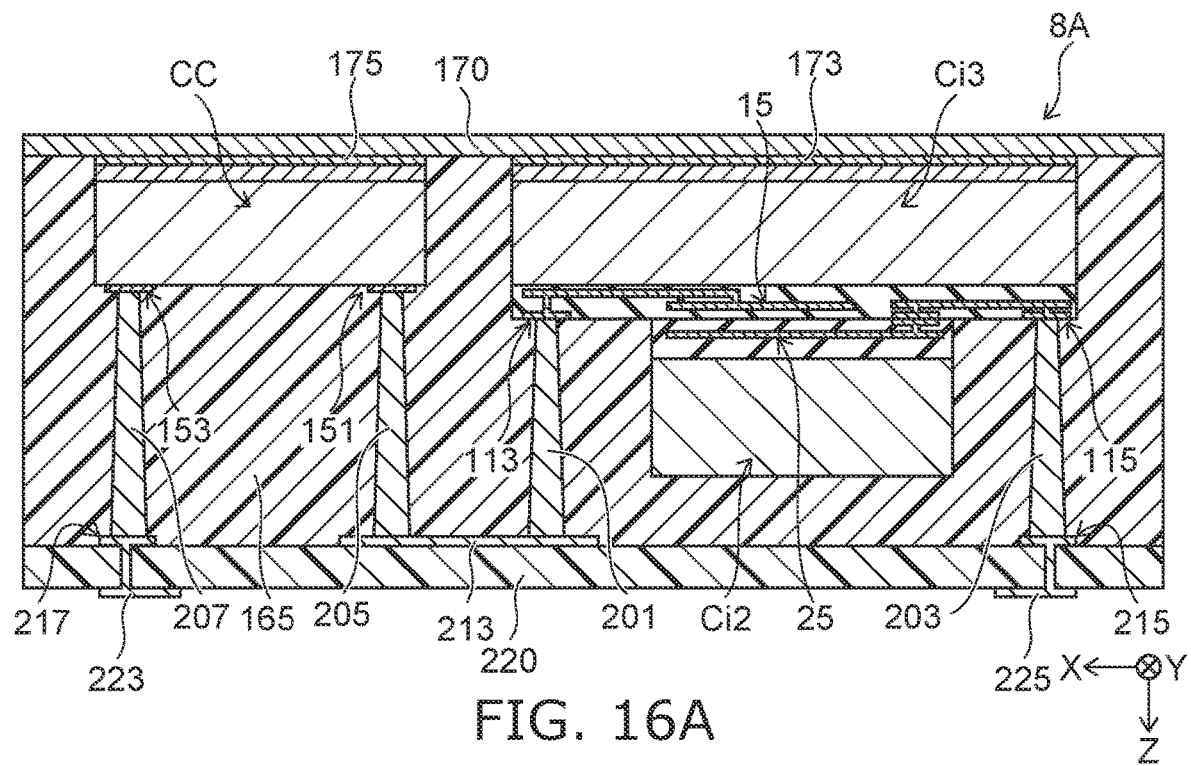
FIGS. 16A and 16B are schematic cross-sectional views showing electronic devices according to a fourth modification of the second embodiment.
Figure 16B:
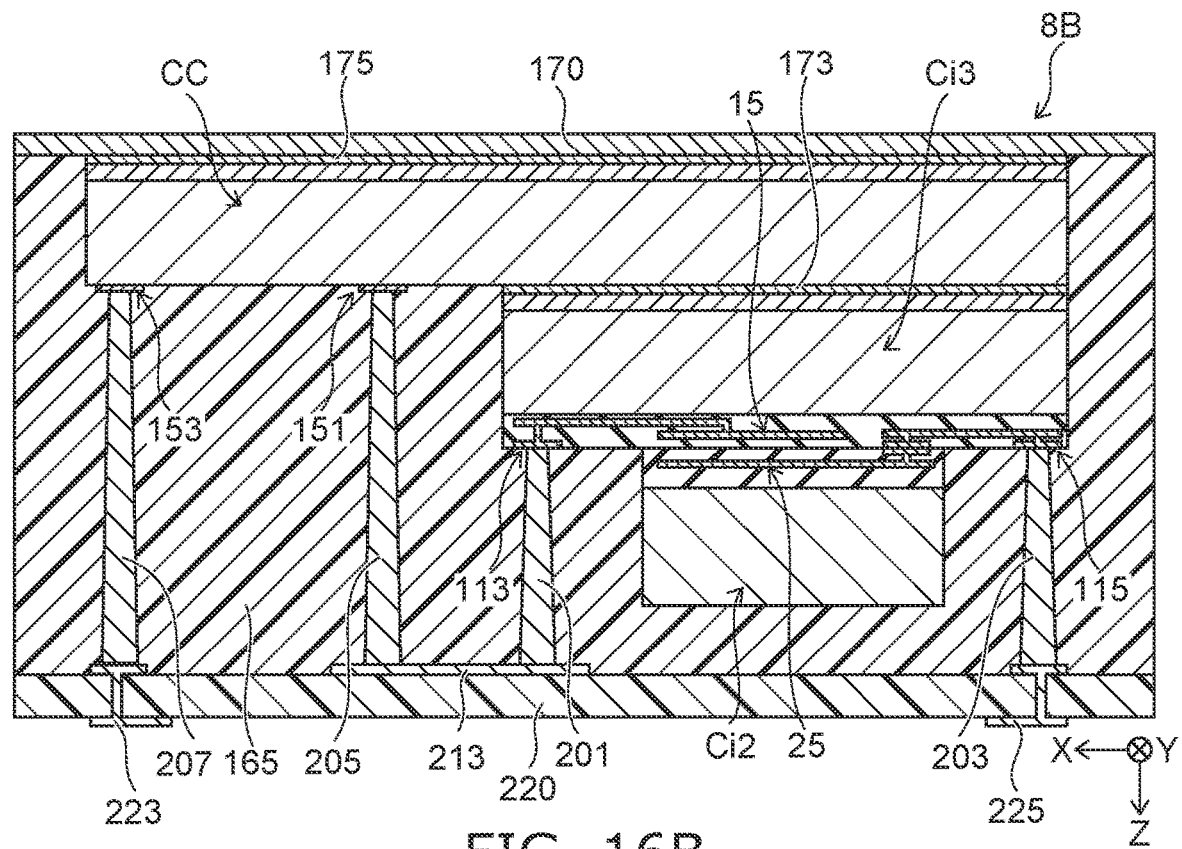

FIGS. 16A and 16B are schematic cross-sectional views showing electronic devices 8A and 8B according to a fourth modification of the second embodiment. The electronic devices 8A and 8B include the second inductor chip Ci2, the third inductor chip Ci3, and the control chip CC. The second inductor chip Ci2, the third inductor chip Ci3, and the control chip CC are sealed on the base 170 by the resin member 165. The control chip CC is a MOSFET. For example, the second inductor chip Ci2 and the third inductor chip Ci3 serve as a transceiver chip and perform the transmission of the signal and the ON/OFF control of an output-side circuit while being insulated from each other.

In the electronic device 8A shown in FIG. 16A, the third inductor chip Ci3 and the control chip CC are respectively mounted on the base 170 via the connection members 173 and 175 such as solder materials and like. The connection members 173 and 175 may be insulating paste having good thermal conductivity. The second inductor chip Ci2 is bonded on the third inductor chip Ci3 so that the first coil 15 and the second coil 25 are magnetically coupled.

For example, the third inductor chip Ci3 is mounted on the base 170 after the second inductor chip Ci2 is bonded to the third inductor chip Ci3. The control chip CC is mounted on the base 170 so that the third inductor chip Ci3 and the control chip CC are arranged thereon.

The resin member 165 is molded on the base 170 to cover the second inductor chip Ci2, the third inductor chip Ci3, and the control chip CC. The resin member 165 includes a front surface that contacts the base 170, and a back surface at the side opposite to the front surface. Connection pads 213, 215, and 217 are provided at the back surface side of the resin member 165.

The electronic device 8A further includes first to fourth connection conductors 201 to 207. The first to fourth connection conductors 201 to 207 are, for example, contact plugs that include copper and extend inside the resin member 165.

The first connection conductor 201 extends in the resin member 165 and electrically connects the connection pad 213 and the first connection terminal 113 of the third inductor chip Ci3. The second connection conductor 203 extends in the resin member 165 and electrically connects the connection pad 215 and the second connection terminal 115 of the third inductor chip Ci3.

The third connection conductor 205 electrically connects the connection pad 213 and the input terminal 151 of the control chip CC. In other words, the first connection terminal 113 of the third inductor chip Ci3 is electrically connected to the input terminal 151 of the control chip CC via the first connection conductor 201, the connection pad 213, and the third connection conductor 205. The fourth connection conductor 207 electrically connects the connection pad 217 and the output terminal 153 of the control chip CC.

The electronic device 8A further includes a dielectric substrate 220 bonded to the back surface side of the resin member 165. The dielectric substrate 220 is, for example, a composite substrate including an epoxy resin, etc. The dielectric substrate 220 includes a front surface that contacts the resin member 165, and a back surface at the side opposite to the front surface.

For example, a first external terminal 223 and a second external terminal 225 are provided at the back surface side of the dielectric substrate 220. The dielectric substrate 220 is bonded to the resin member 165. The first external terminal 223 and the second external terminal 225 are electrically bonded respectively to the connection pads 217 and 215. In other words, the first external terminal 223 is electrically connected to the output terminal 153 of the control chip CC via the fourth connection conductor 207. The second external terminal 225 is electrically connected to the second connection terminal 115 of the third inductor chip Ci3 via the second connection conductor 203.

When the control chip CC is a vertically-conducting element, an additional connection conductor can be provided; and a new terminal can be provided at the side of the external connection terminals 223 and 225. In such a case, the base 170 may be a metal, a ceramic, or a resin. The back electrode of the control chip CC and the new external connection terminal are bonded by the connection conductor.

In the electronic device 8B shown in FIG. 16B, the control chip CC is mounted on the base 170. The third inductor chip Ci3 is mounted on the control chip CC. The second inductor chip Ci2 is bonded on the third inductor chip Ci3 so that the first coil 15 and the second coil 25 are magnetically coupled. For example, the third inductor chip Ci3 is mounted on the control chip CC after the second inductor chip Ci2 is bonded to the third inductor chip Ci3.

For example, the control chip CC is sealed with the resin member 165 on the base 170. The first connection conductor 201, the second connection conductor 203, the third connection conductor 205, and the fourth connection conductor 207 extend inside the resin member 165 from a back surface of the resin member 165 at the side opposite to the base 170. The first connection conductor 201 and the second connection conductor 203 are electrically connected respectively to the first and second connection terminals 113 and 115 of the third inductor chip Ci3. The third connection conductor 205 and the fourth connection conductor 207 are electrically connected respectively to the input terminal 151 and the output terminal 153 of the control chip CC.

The dielectric substrate 220 is connected on the back surface of the resin member 165 after the connection pad 213 that electrically connects the first connection conductor 201 and the third connection conductor 205 is formed on the back surface of the resin member 165. The connection pad 213 is provided between the resin member 165 and the dielectric substrate 220.

The first external terminal 223 and the second external terminal 225 are provided on the surface of the dielectric substrate 220 at the side opposite to the resin member 165. For example, the first external terminal 223 extends through the dielectric substrate 220 and is electrically connected to the fourth connection conductor 207. For example, the second external terminal 225 extends through the dielectric substrate 220 and is electrically connected to the second connection conductor 203.

The first connection terminal 113 of the third inductor chip Ci3 is electrically connected to the input terminal 151 of the control chip CC via the first connection conductor 201, the connection pad 213, and the third connection conductor 205. The second connection terminal 115 is electrically connected to the second external terminal 225 via the second connection conductor 203.

In the examples described above, the input signal that is input from the second external terminal 225 is input to the second coil 25 via the second connection terminal 115 and is output from the first connection terminal 113 via the magnetic coupling between the first coil 15 and the second coil 25. The control chip CC receives, at the input terminal 151, the output of the first connection terminal 113 input via the first connection conductor 201, the connection pad 213, and the third connection conductor 205. The control chip CC outputs a corresponding output signal from the output terminal 153. The output signal of the control chip CC is output to the first external terminal 223 via the fourth connection conductor 207.

Third Embodiment

Figure 17:
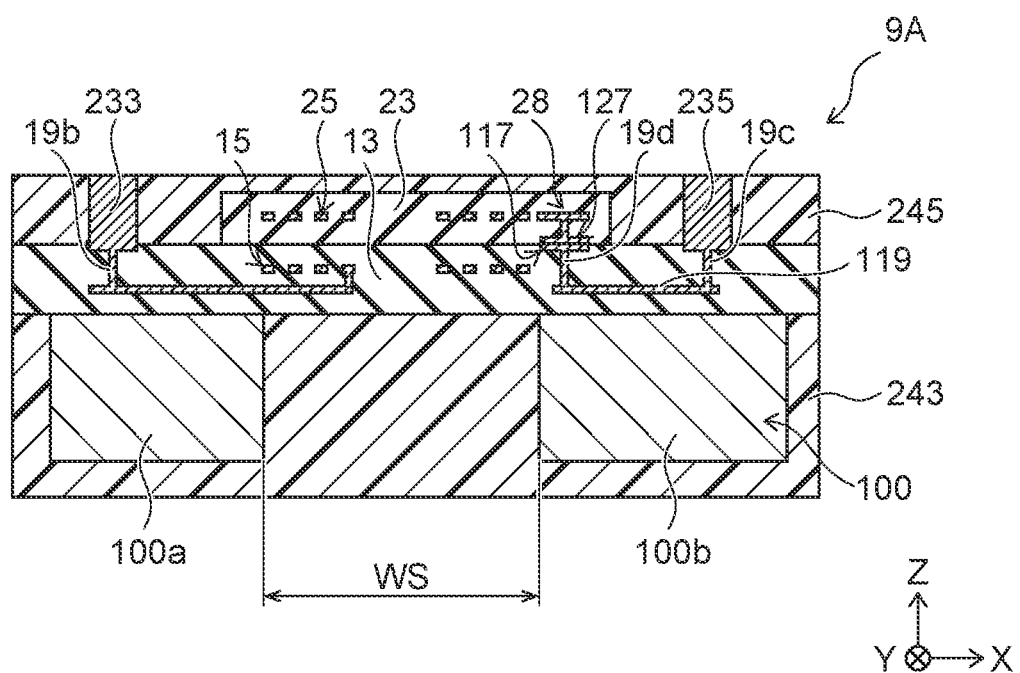
FIG. 17 is a schematic cross-sectional view showing an electronic device according to a third embodiment.

FIG. 17 is a schematic cross-sectional view showing an electronic device 9A according to a third embodiment.

As shown in FIG. 17, the electronic device 9A includes the first substrate 100, the first insulating film 13, the first coil 15, the second insulating film 23, the second coil 25, a first connection conductor 233, and a second connection conductor 235.

The first substrate 100 is, for example, a silicon substrate. The first substrate 100 includes a first portion 100a and a second portion 100b that are separated from each other. The first insulating film 13 is provided on the first substrate 100. The second insulating film 23 is provided on the first insulating film 13.

The first insulating film 13 includes the first coil 15. The second insulating film 23 includes the second coil 25. The second insulating film 23 is bonded to the first insulating film 13 so that the first coil 15 and the second coil 25 are magnetically coupled.

The first insulating film 13 has a back surface that contacts the first substrate 100, and a front surface that contacts the second insulating film 23. The first insulating film 13 further includes the connecting line 119 and a connection terminal 117. The connecting line 119 is provided in the first insulating film 13 and extends in a direction along the front surface of the first insulating film 13. The connection terminal 117 is provided at the front surface side of the first insulating film 13 and is electrically connected to the connecting line 119 via the contact plug 19d.

The second insulating film 23 has a front surface that contacts the first insulating film 13, and a back surface at the side opposite to the front surface. The second insulating film 23 further includes the second connection terminal 127 that is provided at the front surface side of the second insulating film 23 and is electrically connected to the second coil 25 via a contact plug 28.

The first insulating film 13 and the second insulating film 23 are bonded so that the front surfaces of the first and second insulating films 13 and 23 contact each other, and the connection terminal 117 and the second connection terminal 127 contact each other. The connection terminal 117 and the second connection terminal 127 are bonded between the first insulating film 13 and the second insulating film 23.

The length of the first insulating film 13 in a direction along the front surface of the first insulating film 13 (e.g., the X-direction) is greater than the length in the same direction of the second insulating film 23. The first connection conductor 233 and the second connection conductor 235 are provided on the front surface of the first insulating film 13. The first connection conductor 233 and the second connection conductor 235 are provided respectively on the portions of the first insulating film 13 that do not contact the second insulating film 23. The first connection conductor 233 and the second connection conductor 235 are, for example, metal pillars including copper. For example, the second insulating film 23 is provided between the first connection conductor 233 and the second connection conductor 235.

The first connection conductor 233 is electrically connected to the first coil 15, for example, via the contact plug 19b. The second connection conductor 235 is electrically connected to the second coil 25, for example, via the contact plug 19c, the connecting line 119, the contact plug 19d, the connection terminal 117, the second connection terminal 127, and the contact plug 28.

As shown in FIG. 17, the first insulating film 13 includes a first region that is positioned between the first connection conductor 233 and the first portion 100a of the first substrate 100, and a second region that is positioned between the second connection conductor 235 and the second portion 100b of the first substrate 100. The first coil 15 is located between the first region and the second region. For example, a spacing WS between the first portion 100a and the second portion 100b of the first substrate 100 is greater than the coil diameter D1 of the first coil 15 (referring to FIG. 2A).

The electronic device 9A further includes a first resin member 243 and a second resin member 245. The first resin member 243 is provided at the back surface side of the first insulating film 13 and covers the first substrate 100. The first resin member 243 includes a portion that is provided between the first portion 100a and the second portion 100b of the first substrate 100. The second resin member 245 covers the second insulating film 23 at the front surface side of the first insulating film 13. The first connection conductor 233 and the second connection conductor 235 extend inside the second resin member 245 and include end surfaces that are not covered with the second resin member 245.

A method for manufacturing the electronic device 9A according to the third embodiment will now be described with reference to FIGS. 18A to 19C. FIGS. 18A to 19C are schematic cross-sectional views showing manufacturing processes of the electronic device 9A according to the third embodiment.

Figure 18A:
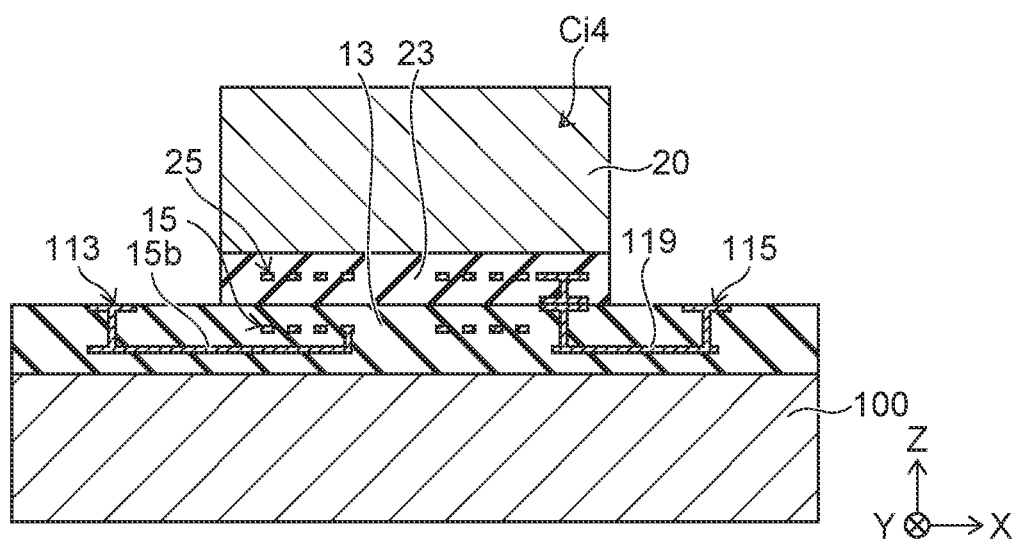
FIGS. 18A to 19C are schematic cross-sectional views showing manufacturing processes of the electronic device according to the third embodiment.

As shown in FIG. 18A, the fourth inductor chip Ci4 is bonded on the first insulating film 13 after the first insulating film 13 is formed on the first substrate 100. The first insulating film 13 includes the first coil 15 and the connecting line 119 (referring to FIGS. 12A to 12C).

Figure 18B:
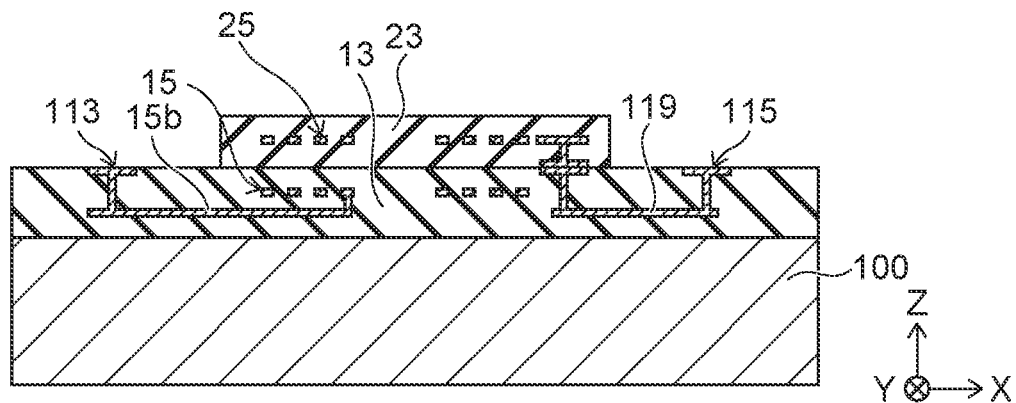

As shown in FIG. 18B, the second substrate 20 of the fourth inductor chip Ci4 is selectively removed. The second substrate 20 is removed by, for example, wet etching.

Figure 18C:
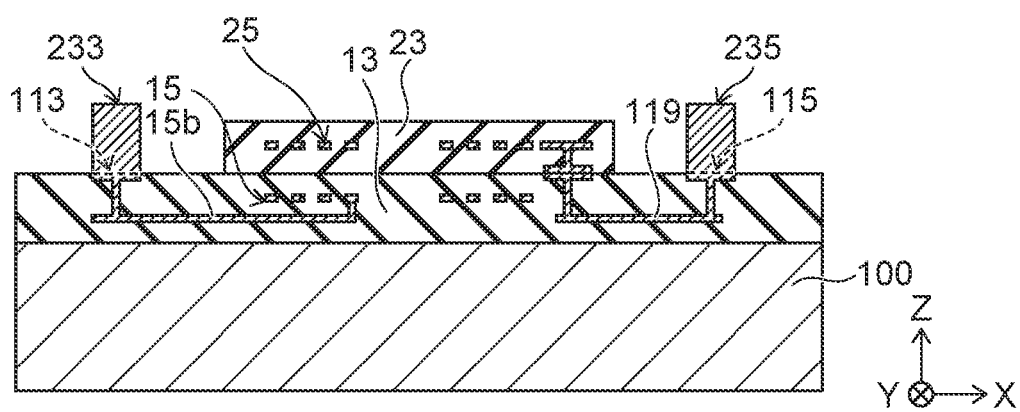

As shown in FIG. 18C, the first connection conductor 233 and the second connection conductor 235 are formed respectively on the first and second connection terminals 113 and 115 that are formed on the first insulating film 13. The first connection conductor 233 and the second connection conductor 235 are formed by, for example, plating.

For example, the first and second connection conductors 233 and 235 are formed using the same material as the materials of the first and second connection terminals 113 and 115. The first connection conductor 233 and the first connection terminal 113 are joined together; and the second connection conductor 235 and the second connection terminal 115 are joined together.

Figure 19A:
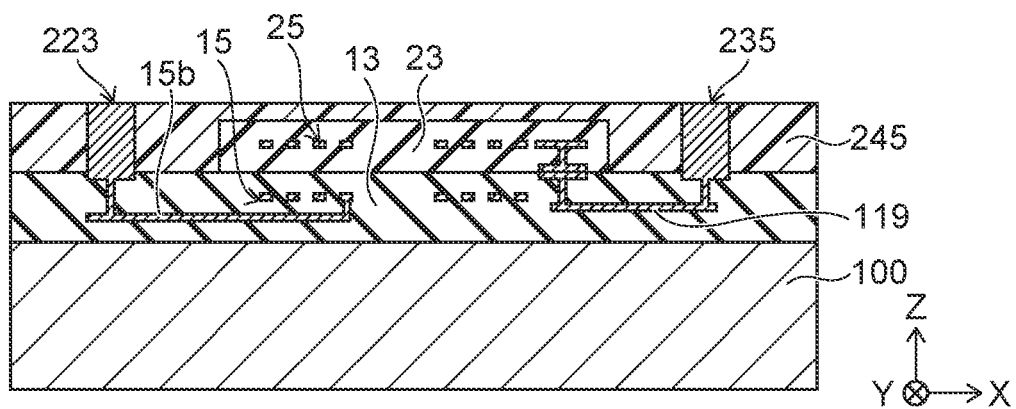

As shown in FIG. 19A, the second resin member 245 is provided at the front surface side of the first insulating film 13 to cover the second insulating film 23, the first connection conductor 233, and the second connection conductor 235. The end surfaces of the first and second connection conductors 233 and 235 are exposed by polishing the front surface of the second resin member 245. The second resin member 245 is, for example, an epoxy resin.

Figure 19B:
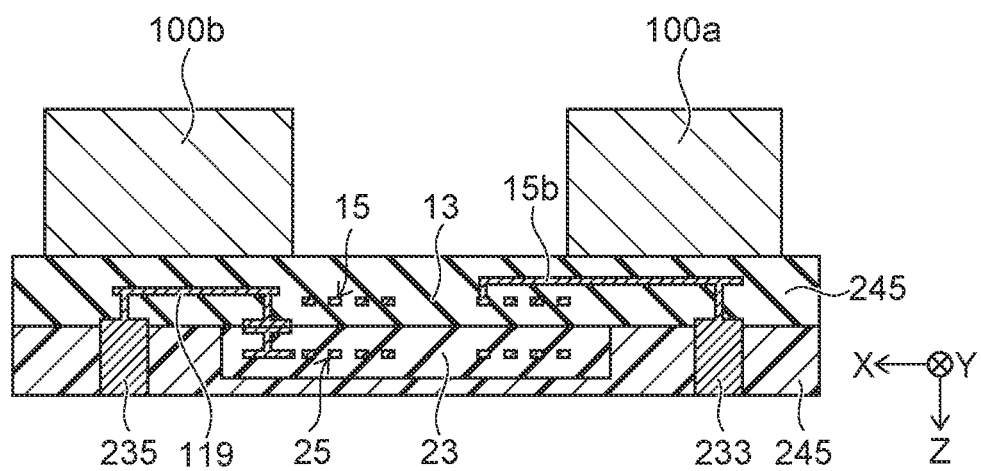

As shown in FIG. 19B, the first insulating film 13 is partially exposed by selectively removing the first substrate 100 at the back surface side of the first substrate 100. The first substrate 100 is selectively removed by, for example, wet etching using a not-illustrated etching mask.

Figure 19C:
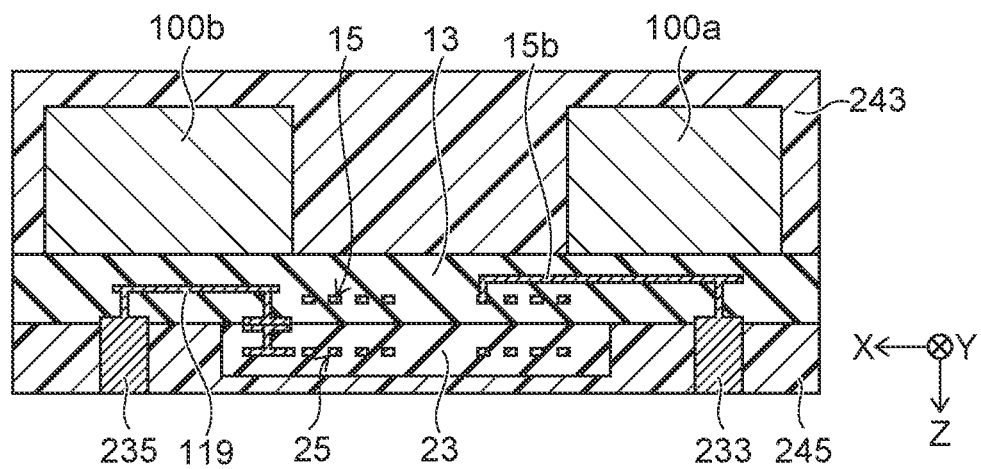

As shown in FIG. 19C, the first resin member 243 is formed at the back surface side of the first insulating film 13 to cover the first substrate 100. The first resin member 243 is, for example, an epoxy resin.

Figure 20:
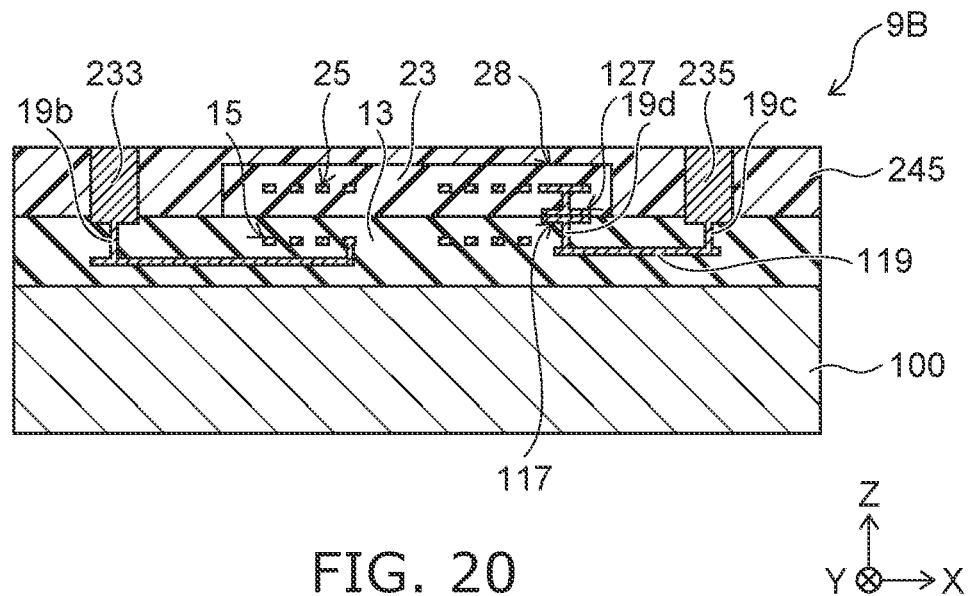
FIG. 20 is a schematic cross-sectional view showing an electronic device according to a modification of the third embodiment.

FIG. 20 is a schematic cross-sectional view showing an electronic device 9B according to a modification of the third embodiment. The electronic device 9B includes the first substrate 100, the first insulating film 13, the first coil 15, the second insulating film 23, the second coil 25, the first connection conductor 233, and the second connection conductor 235.

The first substrate 100 is, for example, a silicon substrate. The first insulating film 13 is provided on the first substrate 100, and the second insulating film 23 is bonded on the front surface of the first insulating film 13. The second insulating film 23 is bonded so that the first coil 15 and the second coil 25 are magnetically coupled. The first connection conductor 233 and the second connection conductor 235 are provided at the front surface side of the first insulating film 13. As shown in the example, the first substrate 100 may be provided to have a continuous body at the back surface side of the first insulating film 13.

According to the embodiment, it is possible to reduce the height of the circuit board on which the electronic devices 9A or 9B is flip-chip mounted.

Fourth Embodiment

FIG. 21 is a schematic cross-sectional view showing an electronic device according to a fourth embodiment. FIG. 21 illustrates a cross section of the first inductor chip Ci1.

As shown in FIG. 21, the first inductor chip Ci1 may include a circuit portion 310 provided at the front surface side of the first substrate 10. The first coil 15 is electrically connected to the circuit portion 310. The first connection terminal 17a is electrically connected to the circuit portion 310 via the contact plug 19a.

For example, the circuit portion 310 outputs a current flowing in the first coil 15 which corresponds to the signal input via the first connection terminal 17a. The circuit portion 310 may be configured to output, via the first connection terminal 17a, a signal corresponding to the current flowing in the first coil 15.

The second inductor chip Ci2 also may include a circuit portion (not-illustrated) provided at the front surface side of the second substrate 20. The first inductor chip Ci1 that is shown in the embodiment also is applicable to the first inductor chip Ci1 of the other embodiments.

Figure 22:
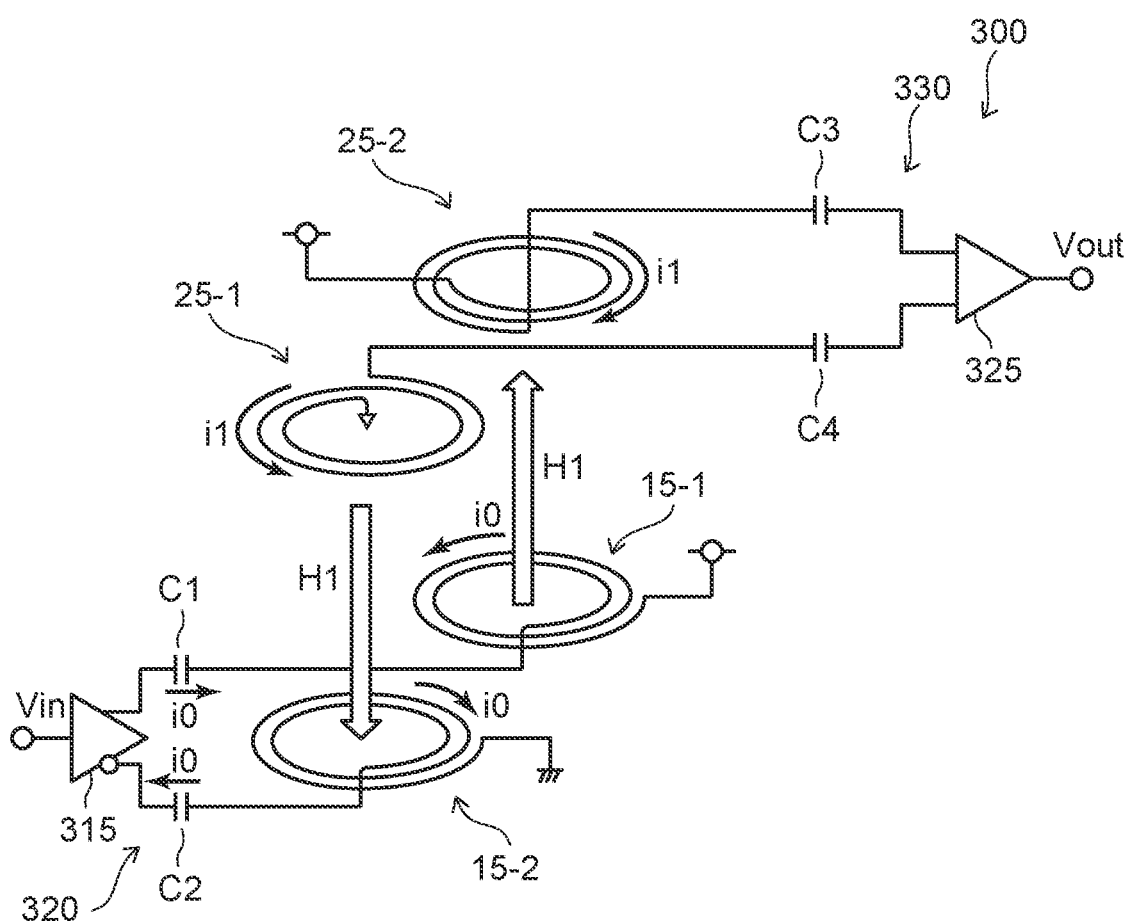
FIG. 22 is a circuit diagram showing the electronic device according to the fourth embodiment.

FIG. 22 is a circuit diagram illustrating the electronic device 300 according to the fourth embodiment. The electronic device 300 includes the first inductor chip Ci1 and the second inductor chip Ci2 (referring to FIG. 1).

In the example, the first inductor chip Ci1 includes a first coil 15-1 and another first coil 15-2. The second inductor chip Ci2 includes a second coil 25-1 and another second coil 25-2. The first coil 15-1 and the first coil 15-2 are provided inside the first insulating film 13. The second coil 25-1 and the second coil 25-2 are provided inside the second insulating film 23.

As shown in FIG. 22, the first coil 15-1 is magnetically coupled with the second coil 25-2. The first coil 15-2 is magnetically coupled with the second coil 25-1.

The electronic device 300 further includes, for example, a first circuit 320 and a second circuit 330. The first circuit 320 includes a differential driver circuit 315, a capacitance C1, and a capacitance C2. The second circuit 330 includes a differential receiving circuit 325, a capacitance C3, and a capacitance C4.

The first circuit 320 is provided, for example, at the front surface side of the first substrate 10. The first circuit 320 is provided between the first substrate 10 and the first insulating film 13. The second circuit 330 is provided, for example, at the front surface side of the second substrate 20. The second circuit 330 is provided between the second substrate 20 and the second insulating film 23.

One end of the first coil 15-1 is connected to a first constant potential. The other end of the first coil 15-1 is connected to the capacitance C1. One end of the first coil 15-2 is connected to a second constant potential. The other end of the first coil 15-2 is connected to the capacitance C2.

One output of the differential driver circuit 315 is connected to the capacitance C1. Another output of the differential driver circuit 315 is connected to the capacitance C2. The capacitance C1 is connected between the differential driver circuit 315 and the first coil 15-1. The capacitance C2 is connected between the differential driver circuit 315 and the first coil 15-2.

One end of the second coil 25-1 is connected to a third constant potential. The other end of the second coil 25-1 is connected to the capacitance C4. One end of the second coil 25-2 is connected to a fourth constant potential. The other end of the second coil 25-2 is connected to the capacitance C3.

The first, second, third, and fourth potentials may be the same potential. The first and second potentials are the same potential. Also, the third and fourth potentials are the same potential. The first and second potentials are desirable to be different from the third and fourth potentials.

One input of the differential receiving circuit 325 is connected to the capacitance C3. The capacitance C3 is provided between the second coil 25-2 and the input of the differential receiving circuit 325. The other input of the differential receiving circuit 325 is connected to the capacitance C4. The capacitance C4 is provided between the second coil 25-1 and the input of the differential receiving circuit 325.

An operation of the electronic device 300 will now be described. In FIG. 22, Vin is the modulated input signal. For example, an edge-triggered technique or on-off keying is used to modulate the input signal. In any method, Vin is the high frequency signal including the modulated original signal.

The differential driver circuit 315 outputs a current i0 flowing in the first coils 15-1 and 15-2. The current i0 corresponds to Vin, and flows in mutually-reverse directions respectively in the first coils 15-1 and 15-2. The first coils 15-1 and 15-2 generate magnetic fields (H1) having mutually-reverse orientations. When the number of winds of the first coil 15-1 is equal to the number of winds of the first coil 15-2, the magnitudes of the generated magnetic fields are equal.

The induced voltage generated in the second coil 25-1 by the magnetic field H1 has the reverse direction to the induced voltage generated in the second coil 25-2 by the magnetic field H1. In the second coils 25-1 and 25-2, a current i1 flows. The magnitude of the induced voltage generated in the second coil 25-1 is equal to the magnitude of the induced voltage generated in the second coil 25-2. Positive and negative voltages are input to the differential receiving circuit 325. In other words, the induced voltages that are generated in the second coils 25-1 and 25-2 are applied respectively to the inputs of the differential receiving circuit 325. One of the input induced voltages is reversed; and 2 times the induced voltage is output as the demodulated signal Vout.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic device, comprising:
   a first substrate;
   a first insulating film provided on the first substrate;
   a first coil provided in the first insulating film;
   a second insulating film provided on the first insulating film;
   a second coil provided in the second insulating film, the first insulating film and the second insulating film contacting each other so that the first coil and the second coil are magnetically coupled, the second insulating film having a front surface contacting the first insulating film, the second insulating film contacting a front surface of the first insulating film, the first insulating film including a first non-contact portion not contacting the second insulating film, the first insulating film including a second non-contact portion not contacting the second insulating film, the second non-contact portion being separated from the first non-contact portion;
   a first terminal provided on the front surface of the first insulating film at the first non-contact portion, the first terminal being electrically connected to the first coil;
   a second terminal provided on the front surface of the first insulating film at the second non-contact portion, the second terminal being electrically connected to the second coil;
   a first connection conductor connected to the first terminal, the first connection conductor being electrically connected to the first coil via the first terminal;
   a second connection conductor connected to the second terminal, the second connection conductor being electrically connected to the second coil via the second terminal;
   a resin member sealing the first substrate, the first insulating film, the second insulating film, the first connection conductor, and the second connection conductor;
   a first external terminal provided on a first surface region of the resin member and electrically connected to the first connection conductor; and
   a second external terminal provided on a second surface region of the resin member and electrically connected to the second connection conductor, the second external terminal being apart from the first external terminal.

2. The device according to claim 1, further comprising a dielectric substrate including the first external terminal and the second external terminal,
   the resin member being provided on the dielectric substrate,
   the first connection conductor and the second connection conductor extending in the resin member,
   the first connection conductor electrically connecting the first terminal and the first external terminal,
   the second connection conductor electrically connecting the second terminal and the second external terminal.

3. The device according to claim 2, further comprising a control element electrically connected to the first coil via the first connection conductor,
   the first external terminal electrically connected to the first connection conductor via the control element and other connection conductor.

4. The device according to claim 3, wherein the control element is provided on the dielectric substrate.

5. The device according to claim 4, wherein
   the first substrate is provided on the dielectric substrate, and
   the first substrate is apart from the control element.

6. The device according to claim 1, wherein
   the first external terminal is provided on the first surface region in a top surface of the resin member, and
   the second external terminal is provided on the second surface region in the top surface of the resin member.

7. An electronic device, comprising:
   a first substrate;
   a first insulating film provided on the first substrate;
   a first coil provided in the first insulating film;
   a second insulating film provided on the first insulating film;
   a second coil provided in the second insulating film, the first insulating film and the second insulating film contacting each other so that the first coil and the second coil are magnetically coupled, the second insulating film having a front surface contacting the first insulating film, the second insulating film contacting a front surface of the first insulating film, the first insulating film including a first non-contact portion not contacting the second insulating film, the first insulating film including a second non-contact portion not contacting the second insulating film, the second non-contact portion being separated from the first non-contact portion;
   a first terminal provided on the front surface of the first insulating film at the first non-contact portion, the first terminal being electrically connected to the first coil;
   a second terminal provided on the front surface of the first insulating film at the second non-contact portion, the second terminal being electrically connected to the second coil;
   a first contact plug connected to the first terminal, the first contact plug being electrically connected to the first coil via the first terminal;
   a second contact plug connected to the second terminal, the second contact plug being electrically connected to the second coil via the second terminal;
   a resin member sealing the first substrate, the first insulating film, the second insulating film, the first contact plug, and the second contact plug;
   a first external terminal provided on a first surface region of the resin member and electrically connected to the first contact plug;

a second external terminal provided on a second surface region of the resin member and electrically connected to the second contact plug, the second external terminal being apart from the first external terminal;
a dielectric substrate including the first external terminal and the second external terminal;
a control element electrically connected to the first coil via the first contact plug; and
a third contact plug electrically connecting the control element and the first external terminal,
the dielectric substrate being provided on the resin member,
the first contact plug, the second contact plug, and the third contact plug extending in the resin member,
the second contact plug electrically connecting the second terminal and the second external terminal.

8. The device according to claim 7, wherein
the first substrate is mounted on the control element.

9. The device according to claim 7, further comprising:
a heat dissipation base connected to the control element,
the resin member being provided between the heat dissipation base and the dielectric substrate.

10. The device according to claim 9, wherein
the first substrate is connected to the heat dissipation base, the first substrate being apart from the control element.

11. An electronic device, comprising:
a first substrate;
a first insulating film provided on the first substrate;
a first coil provided in the first insulating film;
a second insulating film provided on the first insulating film;
a second coil provided in the second insulating film, the first insulating film and the second insulating film contacting each other so that the first coil and the second coil are magnetically coupled, the second insulating film having a front surface contacting the first insulating film, the second insulating film contacting a front surface of the first insulating film, the first insulating film including a first non-contact portion not contacting the second insulating film, the first insulating film including a second non-contact portion not contacting the second insulating film, the second non-contact portion being separated from the first non-contact portion;
a first terminal provided on the front surface of the first insulating film at the first non-contact portion, the first terminal being electrically connected to the first coil;
a second terminal provided on the front surface of the first insulating film at the second non-contact portion, the second terminal being electrically connected to the second coil;
a first connection conductor connected to the first terminal, the first connection conductor being electrically connected to the first coil via the first terminal;
a second connection conductor connected to the second terminal, the second connection conductor being electrically connected to the second coil via the second terminal; and
a first resin member covering the first and second insulating films and the first and second connection conductors on the first insulating film,
the first connection conductor and the second connection conductor including end surfaces not covered with the first resin member.

12. The device according to claim 11, further comprising:
a second resin member covering the first substrate, the first insulating film and the second insulating film being provided between the first resin member and the second resin member,
the first substrate including a first portion, and a second portion apart from the first portion,
the first insulating film including a portion between the first connection conductor and the first portion of the first substrate and another portion between the second connection conductor and the second portion of the first substrate,
the second resin member including a portion positioned between the first portion and the second portion, and
the first coil and the second coil being positioned between the first resin member and the portion of the second resin member.

13. The device according to claim 11, wherein
the first terminal and the first connection conductor are combined into one body, and
the second terminal and the second connection conductor are combined into another one body.

14. An electronic device, comprising:
a first insulating film including a first coil;
a second insulating film including a second coil, the second insulating film provided on a first surface of the first insulating film so that the first coil and the second coil are magnetically coupled;
a first connection conductor electrically connected to the first coil, the first connection conductor extending along a first direction from the first surface of the first insulating film, the first direction being from the first insulating film to the second insulating film;
a second connection conductor electrically connected to the second coil, the second connection conductor extending along the first direction from the first surface of the first insulating film;
a circuit portion including a first circuit and a second circuit, the first coil being electrically connected to the first connection conductor via the first circuit, the second coil being electrically connected to the second connection conductor via the second circuit; and
a first substrate, a portion of the first insulating film being provided between the second insulating film and the first substrate, the first circuit being provided between the first insulating film and the first substrate.

15. The device according to the claim 14, wherein
the first substrate is provided on a second surface of the first insulating film opposing to the first surface.

16. The device according to the claim 14, further comprising a second substrate separated from the first substrate, wherein
a portion of the first insulating film being located between the first connection conductor and the first substrate, and
an other portion of the first insulating film being located between the second connection conductor and the second substrate.

17. The device according to the claim 14, further comprising:
a first resin member, the first substrate located between the first resin member and the first insulating film; and
a second substrate separated from the first substrate, the second substrate located between the first resin member and the first insulating film,
the first resin member including a portion located between the first substrate and the second substrate, the first resin member sealing the first substrate and the second substrate.

18. The device according to the claim 14, further comprising a second substrate separated from the first substrate,
the first substrate and the second substrate being provided on a second surface of the first insulating film opposing to the first surface,
the first circuit being provided at the first substrate, and the second circuit being provided at the second substrate.

19. The device according to the claim 14, further comprising:
an insulating layer covering the first connection conductor, the second connection conductor, the first insulating film, and the second insulating film,
wherein a top end portion of the first connection conductor and a top end portion of the second connection conductor are not covered with the insulating layer.

* * * * *